(12) United States Patent
Wu et al.

(10) Patent No.: US 11,037,902 B2
(45) Date of Patent: Jun. 15, 2021

(54) LIGHT-EMITTING APPARATUS INCLUDING SACRIFICIAL PATTERN AND MANUFACTURING METHOD THEREOF

(71) Applicant: Au Optronics Corporation, Hsinchu (TW)

(72) Inventors: Tsung-Tien Wu, Hsinchu County (TW); Chin-Yuan Ho, Hsinchu (TW); Chu-Yu Liu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/518,962

(22) Filed: Jul. 22, 2019

(65) Prior Publication Data
US 2020/0219839 A1  Jul. 9, 2020

(30) Foreign Application Priority Data

Jan. 4, 2019  (TW) .................................. 108100342

(51) Int. Cl.
| H01L 23/00 | (2006.01) |
| H01L 23/492 | (2006.01) |
| H01L 27/12 | (2006.01) |
| H01L 27/15 | (2006.01) |

(52) U.S. Cl.
CPC .......... *H01L 24/83* (2013.01); *H01L 23/4924* (2013.01); *H01L 27/127* (2013.01); *H01L 27/15* (2013.01)

(58) Field of Classification Search
CPC ... H01L 24/83; H01L 23/4924; H01L 27/127; H01L 27/15

USPC .......................................................... 257/103
See application file for complete search history.

(56) References Cited

U.S. PATENT DOCUMENTS

| 8,333,860 | B1 | 12/2012 | Bibl et al. |
| 8,646,505 | B2 | 2/2014 | Bibl et al. |
| 8,709,844 | B2 | 4/2014 | Kang et al. |
| 9,620,478 | B2 | 4/2017 | Bibl et al. |
| 9,773,750 | B2 | 9/2017 | Bibl et al. |
| 10,283,685 | B2 | 5/2019 | Kim et al. |
| 2002/0187571 | A1* | 12/2002 | Collins, III ............. H01L 33/50 438/29 |

(Continued)

FOREIGN PATENT DOCUMENTS

| CN | 101984511 | 3/2011 |
| CN | 102104108 | 6/2011 |

(Continued)

*Primary Examiner* — Thao X Le
*Assistant Examiner* — Eric W Jones
(74) *Attorney, Agent, or Firm* — JCIPRNET

(57) ABSTRACT

A light-emitting apparatus includes a substrate, pads disposed on the substrate, a sacrificial pattern layer and a light-emitting diode element disposed on the sacrificial pattern layer. The light-emitting diode element includes a first type semiconductor layer, a second type semiconductor layer, an active layer, and electrodes. A connection patterns disposed on at least one of the electrodes and the pads. Materials of the connection patterns include hot fluidity conductive materials. The connection patterns cover a sidewall of the sacrificial pattern layer and are electrically connected to the at least one of the electrodes and the pads. In addition, the manufacturing method of the above light-emitting apparatus is also proposed.

5 Claims, 36 Drawing Sheets

(56) References Cited

U.S. PATENT DOCUMENTS

| | | | |
|---|---|---|---|
| 2004/0169288 A1* | 9/2004 | Hsieh | H05K 3/4007 |
| | | | 257/780 |
| 2011/0147779 A1* | 6/2011 | Kang | H01L 33/486 |
| | | | 257/98 |
| 2011/0249106 A1* | 10/2011 | Makino | H05K 1/189 |
| | | | 348/76 |
| 2013/0127020 A1 | 5/2013 | Bibl et al. | |
| 2013/0130416 A1 | 5/2013 | Bibl et al. | |
| 2013/0187192 A1* | 7/2013 | Hoeppel | H01L 31/18 |
| | | | 257/99 |
| 2013/0210194 A1 | 8/2013 | Bibl et al. | |
| 2014/0061704 A1* | 3/2014 | Yamada | H01L 33/62 |
| | | | 257/98 |
| 2014/0217436 A1* | 8/2014 | Hussell | H01L 33/62 |
| | | | 257/98 |
| 2014/0217450 A1* | 8/2014 | Ishigami | H01L 33/46 |
| | | | 257/98 |
| 2014/0332820 A1* | 11/2014 | Han | H01L 33/32 |
| | | | 257/76 |
| 2017/0279020 A1 | 9/2017 | Kim et al. | |
| 2018/0204991 A1 | 7/2018 | Kim et al. | |

FOREIGN PATENT DOCUMENTS

| | | |
|---|---|---|
| CN | 1040309914 | 9/2014 |
| CN | 104115266 | 2/2017 |
| CN | 106373895 | 2/2017 |
| CN | 107104169 | 1/2019 |
| TW | 201327695 | 7/2013 |
| TW | 201622177 | 6/2016 |
| TW | 201817049 | 5/2018 |
| TW | I660524 | 5/2019 |

* cited by examiner

LIGHT-EMITTING APPARATUS INCLUDING SACRIFICIAL PATTERN AND MANUFACTURING METHOD THEREOF

CROSS-REFERENCE TO RELATED APPLICATION

This application claims the priority benefit of Taiwan application serial no. 108100342, filed on Jan. 4, 2019. The entirety of the above-mentioned patent application is hereby incorporated by reference herein and made a part of this specification.

BACKGROUND

Field of the Disclosure

The present disclosure relates to an electronic apparatus and a manufacturing method thereof, and more particularly to a light-emitting apparatus and a manufacturing method thereof.

Description of Related Art

The transfer micro-device technique is applied in the process of new electronic apparatuses. In the case of the process of a light emitting apparatus, the process of the light emitting apparatus includes the following steps: providing a transfer stamp having a plurality of transfer blocks; providing a plurality of light-emitting diode elements to make the transfer block of the transfer stamp to contact the light-emitting diode element and further pick up the light-emitting diode element to be used; transferring the light-emitting diode element to an adhesive layer of a receiving substrate by using the transfer stamp; manufacturing an interconnection layer on the receiving substrate carrying the plurality of light-emitting diode elements such that the light-emitting diode elements are electrically connected to the pads of the receiving substrate. However, the plurality of light-emitting diode elements, the pads of the receiving substrate and the interconnection layer must be accurately aligned with each other so that the light-emitting diode elements can be electrically connected to the pads of the receiving substrate, which makes it difficult for the yield rate of light-emitting apparatus to be improved.

SUMMARY OF THE DISCLOSURE

The disclosure provides a light-emitting apparatus and a manufacturing method thereof, which have high yield rate.

A light-emitting apparatus of the present disclosure includes a substrate, a plurality of pads, a sacrificial pattern layer, a light-emitting diode element, and a plurality of connection patterns. The plurality of pads are disposed on the substrate. The sacrificial pattern layer is disposed on the substrate. The light-emitting diode element is disposed on the sacrificial pattern layer. The light-emitting diode element includes a first type semiconductor layer, a second type semiconductor layer with respect to the first type semiconductor layer, an active layer between the first type semiconductor layer and the second type semiconductor layer, and a plurality of electrodes respectively electrically connected to the first type semiconductor layer and the second type semiconductor layer. The plurality of connection patterns respectively disposed on at least one of the plurality of electrodes and the plurality of pads. The material of the plurality of connection patterns includes a hot fluidity conductive material, and the plurality of connection patterns cover sidewalls of the sacrificial pattern layer and are electrically connected to the at least one of the plurality of pads and the plurality of electrodes.

A manufacturing method of a light-emitting apparatus of the present disclosure includes the steps of: providing a substrate and a plurality of pads disposed on the substrate; forming a sacrificial material layer on the substrate to cover the plurality of pads; and disposing a light-emitting diode element on the sacrificial material layer, wherein the light-emitting diode element includes a first type semiconductor layer, a second type semiconductor layer, an active layer disposed between the first type semiconductor layer and the second type semiconductor layer, and a plurality of electrodes respectively electrically connected to the first type semiconductor layer and the second type semiconductor layer; forming a plurality of connection patterns disposed on at least one of the plurality of electrodes and the plurality of pads, and the material of the plurality of connection patterns includes a hot fluidity conductive material; patterning the sacrificial material layer to form a sacrificial pattern layer, and forming a plurality of gaps between the plurality of connection patterns and the plurality of pads or between the plurality of pads and the plurality of electrodes, wherein the sacrificial pattern layer exposes at least a portion of each of the plurality of pads; and performing a heating process to make the plurality of connection patterns to flow to be electrically connected to the at least one of the plurality of pads and the plurality of electrodes.

In order to make the aforementioned features and advantages of the disclosure more comprehensible, embodiments accompanying figures are described in detail below.

DESCRIPTION OF EMBODIMENTS

Figure 1A:
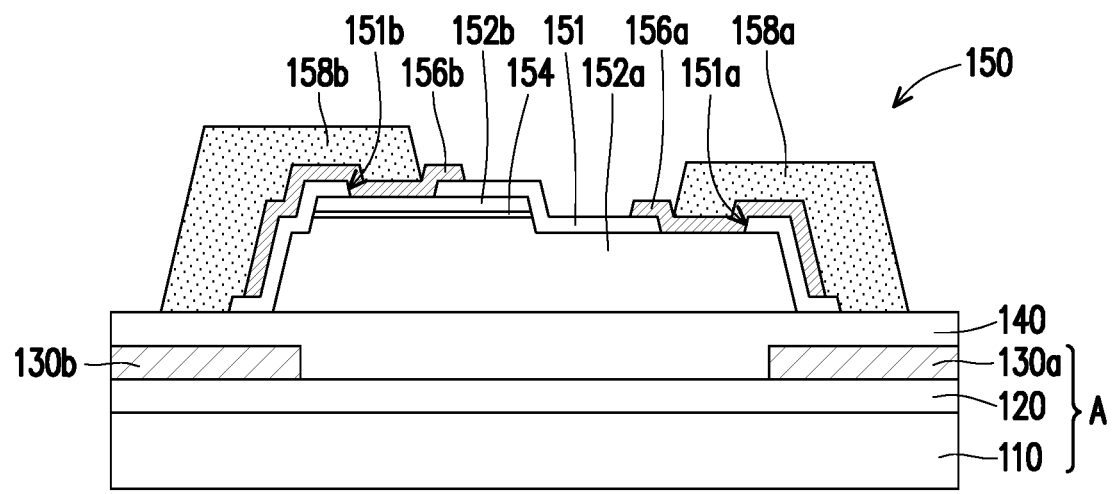
FIG. 1A to FIG. 1C are schematic cross-sectional views showing a manufacturing process of a light-emitting apparatus according to a first embodiment of the present disclosure.

In the accompanying drawings, thicknesses of layers, films, panels, regions and so on are exaggerated for clarity. Throughout the specification, the same reference numerals in the accompanying drawings denote the same devices. It should be understood that when an element such as a layer, film, region or substrate is referred to as being "on another element" or "connected to another element," it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected. Furthermore, "electrical connection" or "coupling" may be that other elements are present between two elements.

The term "about," "similar," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system) or the limitations of the manufacturing system. For instance, "about" may mean within one or more standard deviations, or within, for example, ±30%, ±20%, ±10%, or ±5% of the stated value. Moreover, a relatively acceptable range of deviation or standard deviation may be chosen for the term "about," "approximately," or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Exemplary embodiments of the disclosure are described with reference of schematic cross-sectional views of the idealized embodiments. Therefore, a shape variation of the drawings as a result of a manufacturing technique and/or manufacturing tolerance, for example, is expected. Therefore, the embodiments of the disclosure should not be interpreted as being limited to specific shapes of the regions shown in the drawings but may include a shape deviation caused during manufacture, for example. For example, a flat area shown in the figures or described herein may practically have rough and/or non-linear characteristics. Moreover, an acute angle shown in the drawings can practically be rounded. Therefore, the shapes shown in the figures are substantially schematic, and the shapes therein are not intended to represent accurate shapes, and are not intended to serve as limitations of the claims.

Reference will now be made in detail to the exemplary embodiments. Examples of exemplary embodiments are described in the accompanying drawings. Wherever possible, the same reference symbols are used to denote the same or similar parts in the drawings and the description.

Figure 1B:
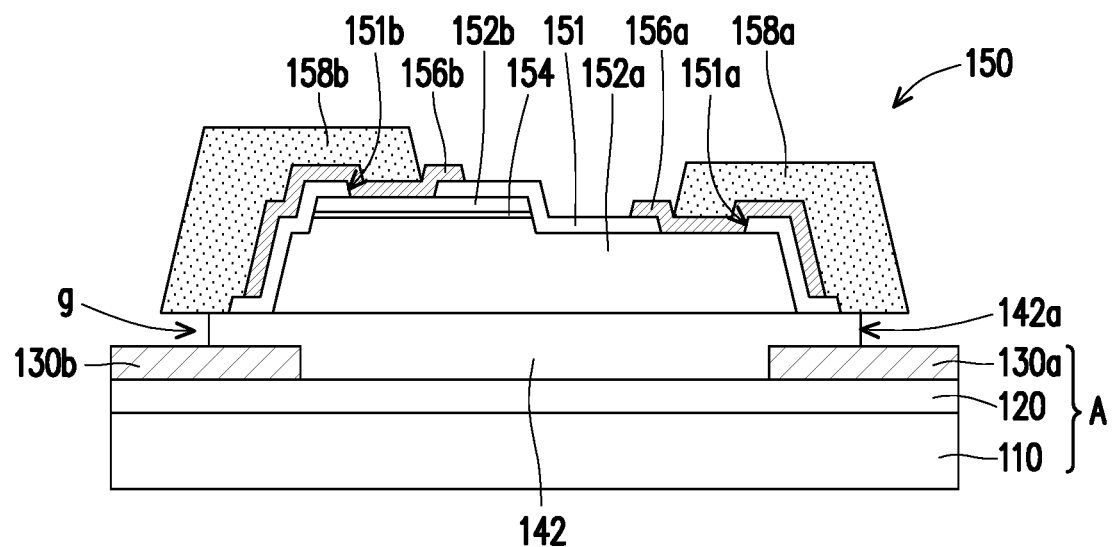
Figure 1C:
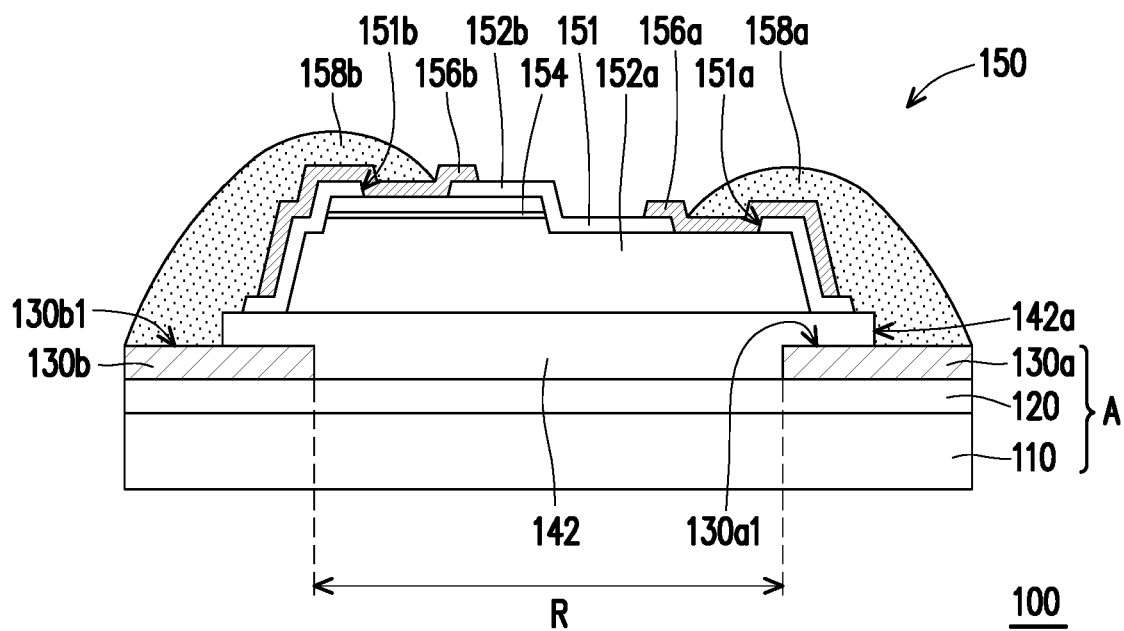

FIG. 1A to FIG. 1C are schematic cross-sectional views showing a manufacturing process of a light-emitting apparatus according to a first embodiment of the present disclosure.

Referring to FIG. 1A, first, an active device substrate A is provided. The active device substrate A includes a substrate 110 and a plurality of pads 130a and 130b disposed on the substrate 110. In this embodiment, the material of the pads 130a and 130b is, for example, metal, but the disclosure is not limited thereto. In this embodiment, the active device substrate A further includes a driving circuit layer 120 electrically connected to the pads 130a and 130b. For example, the driving circuit layer 120 may include a data line (not shown), a scan line (not shown), a power line (not shown), a common line (not shown), a first transistor (not shown) and a second transistor (not shown). The first transistor has a first end, a second end and a control end, and the second transistor also has a first end, a second end and a control end. The first end of the first transistor is electrically connected to the data line, the control end of the first transistor is electrically connected to the scan line, the second end of the first transistor is electrically connected to the control end of the second transistor, and the first end of the second transistor is electrically connected to the power line. The second end of the second transistor is electrically connected to one of the pads 130a and 130b, and the other of the pads 130a and 130b is electrically connected to the common line. However, the present disclosure is not limited thereto, and in other embodiments, the driving circuit layer 120 may be of other forms.

Referring to FIG. 1A, then, a sacrificial material layer 140 is formed on the substrate 110 to cover the plurality of pads 130a and 130b. The sacrificial material layer 140 can also be referred to as a bonding layer. For example, in this embodiment, the material of the sacrificial material layer 140 may be a photoresist, a heat curing adhesive or other suitable material.

Referring to FIG. 1A, next, a light-emitting diode element 150 is disposed on the sacrificial material layer 140. The light-emitting diode element 150 is bonded to the active device substrate A through the sacrificial material layer 140. The light-emitting diode element 150 includes a first type semiconductor layer 152a, a second type semiconductor layer 152b, an active layer 154 disposed between the first type semiconductor layer 152a and the second type semiconductor layer 152b, and a plurality of electrodes 156a and 156b electrically connected to the first type semiconductor layer 152a and the second type semiconductor layer 152b respectively.

In the present embodiment, the plurality of electrodes 156a and 156b are located on the same side of the first type semiconductor layer 152a. That is, the light-emitting diode element 150 is a horizontal light-emitting diode. In addition, the light-emitting diode element 150 further includes an insulating layer 151 disposed on the first type semiconductor layer 152a and the second type semiconductor layer 152b and having a plurality of openings 151a and 151b respectively overlapping the first type semiconductor layer 152a and the second type semiconductor layer 152b, wherein the plurality of electrodes 156a and 156b are electrically connected to the first type semiconductor layer 152a and the second type semiconductor layer 152b through the plurality of openings 151a and 151b, respectively.

It should be noted that the first embodiment of the present disclosure further includes a plurality of connection patterns 158a and 158b, and the materials of the plurality of connection patterns 158a, 158b include hot fluidity conductive materials. The hot fluidity conductive materials can flow after being heated. The temperature resistance of the active device substrate A and the sacrificial material layer 140 is higher than the temperature resistance of the hot fluidity conductive material. For example, in the present embodiment, the material of the hot fluidity conductive material may include indium (In), tin (Sn), other suitable materials, or a combination thereof, but the disclosure is not limited thereto.

The plurality of connection patterns 158a and 158b can be forming on at least one of the plurality of electrodes 156a and 156b and the plurality of plurality of pads 130a and 130b. In other words, the plurality of connection patterns 158a and 158b can be disposed between of the plurality of electrodes 156a and 156b and the plurality of plurality of pads 130a and 130b, and may be having three models. First model, the plurality of connection patterns 158a and 158b are as one portion of the light-emitting diode element 150. Second model, the plurality of connection patterns 158a and 158b are respectively disposed on the plurality of pads 130a and 130b. Third model, one portion of the plurality of connection patterns 158a and 158b are respectively disposed on the plurality of pads 130a and 130b, and another portion of the plurality of connection patterns 158a and 158b are as one portion of the light-emitting diode element 150. Embodiments of the present disclosure are description below with the first model as a preferably exemplary embodiment, but not limited thereto. Other models of the embodiments can be analogous. The plurality of connection patterns 158a and 158b of the light-emitting diode element 150 are respectively disposed on the plurality of electrodes 156a and 156b. For example, in the embodiment, the connection patterns 158a and 158b are not only disposed on the electrodes 156a and 156b, but also disposed on the stacked sidewall constituted by the first type semiconductor layer 152a, the second type semiconductor layer 152b, and the active layer 154, but the disclosure is not limited thereto.

Referring to FIG. 1A and FIG. 1B, next, the sacrificial material layer 140 in the one model is patterned to form the sacrificial pattern layer 142, and a plurality of gaps g are formed between the plurality of connection patterns 158a and 158b and the plurality of pads 130a and 130b, wherein the sacrificial pattern layer 142 exposes at least a portion of each of the plurality of pads 130a and 130b. When in the second model, the plurality of gaps g are formed between the plurality of electrodes 156a and 156b and the plurality of pads 130a and 130b. In other words, the plurality of gaps g are formed between the plurality of connection patterns 158a and 158b and the plurality of pads 130a and 130b or between the plurality of pads 130a and 130b and the plurality of electrodes 156a and 156b.

For example, in the embodiment, the sacrificial material layer 140 is over-etched by using the light-emitting diode element 150 as a mask to form the sacrificial pattern layer 142. There are a plurality of gaps g between the sidewall 142a of the sacrificial pattern layer 142, the connection patterns 158a and 158b, and the plurality of pads 130a and 130b. In this embodiment, the vertical projection of the sacrificial pattern layer 142 on the substrate 110 may be within a vertical projection of the light-emitting diode element 150 on the substrate 110, and the area of the vertical projection of the sacrificial pattern layer 142 on the substrate 110 may be less than the area of the vertical projection of the light-emitting diode element 150 on the substrate 110, but the disclosure is not limited thereto.

Referring to FIG. 1B and FIG. 1C, a heating process is then performed to make the plurality of connection patterns 158a and 158b become flowable, and the flowable connection patterns 158a and 158b flow downward by gravity, and are respectively electrically connected to the at least one of the plurality to pads 130a and 130b and the plurality of electrodes 156a and 156b. The above heating process may be local heating or global heating depending on actual needs. For example, local heating may be performed by using laser welding; global heating may be performed by using a heating oven or a hot plate; however, the present disclosure is not limited thereto. At the present stage, the light-emitting apparatus 100 of the present embodiment is completed. In the present embodiment, the light-emitting apparatus 100 is, for example, a display apparatus. However, the present disclosure is not limited thereto. In other embodiments, the light-emitting apparatus 100 may also be an electronic apparatus that provides an illumination beam, such as but not limited to: a backlight.

It should be mentioned that, in this embodiment, the sacrificial material layer 140 under the light-emitting diode element 150 is patterned by using the light-emitting diode element 150 as a mask to form the sacrificial pattern layer 142; then, the connection patterns 158a and 158b inherently belonging to the light-emitting diode element 150 are respectively flowed onto the pads 130a and 130b of the active device substrate A to electrically connect the light-emitting diode element 150 and the active device substrate A. In this manner, the alignment accuracy requirement between the plurality of light-emitting diode elements 150 that are mass transferred and the plurality of pads 130a and 130b of the active device substrate A can be reduced, thereby improving the yield rate of the light-emitting apparatus 100.

Referring to FIG. 1C, the light-emitting apparatus 100 includes a substrate 110, a plurality of pads 130a and 130b, a sacrificial pattern layer 142, and a light-emitting diode element 150. The plurality of pads 130a and 130b are disposed on the substrate 110. The sacrificial pattern layer 142 is at least disposed in a region R between the plurality of pads 130a and 130b and has a sidewall 142a. The light-emitting diode element 150 is disposed on the sacrificial pattern layer 142. The sacrificial pattern layer 142 is disposed between the first type semiconductor layer 152a of the light-emitting diode element 150 and the substrate 110. The connection patterns 158a and 158b cover the sidewall 142a of the sacrificial pattern layer 142 and are electrically connected to the at least one of the plurality of pads 130a and 130b and the plurality of electrodes 156a and 156b. In the first model, the connection patterns 158a and 158b cover the sidewall 142a of the sacrificial pattern layer 142 and are electrically connected to the at least one of the plurality of pads 130a and 130b, but not limited thereto. In this embodiment, the connection patterns 158a and 158b may be in contact with the sidewall 142a of the sacrificial pattern layer 142 and the surfaces 130a1 and 130b1 of the plurality of pads 130a and 130b, but the disclosure is not limited thereto.

In the present embodiment, the active layer 154 of the light-emitting diode element 150 may be disposed between the plurality of electrodes 156a and 156b of the light-emitting diode element 150 and the sacrificial pattern layer 142. That is, in the present embodiment, the plurality of electrodes 156a and 156b of the light-emitting diode element 150 may optionally face upward. However, the present disclosure is not limited thereto, and according to other embodiments, the plurality of electrodes 156a and 156b of the light-emitting diode element 150 may face downward, as exemplified below with other FIG. 2A through FIG. 2C.

Figure 2A:
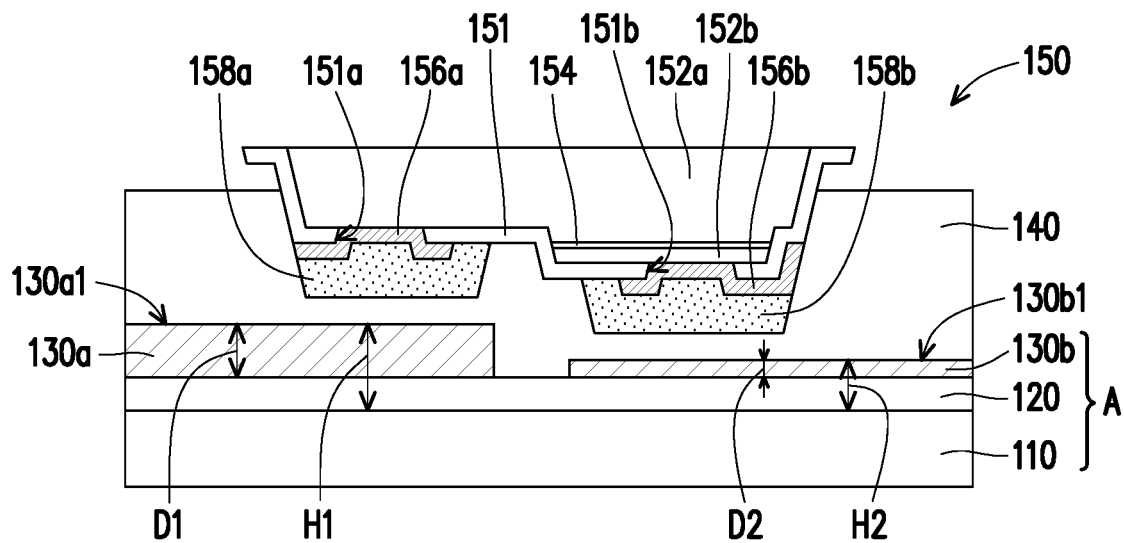
FIG. 2A to FIG. 2C are schematic cross-sectional views showing a manufacturing process of a light-emitting apparatus according to a second embodiment of the present disclosure.
Figure 2B:
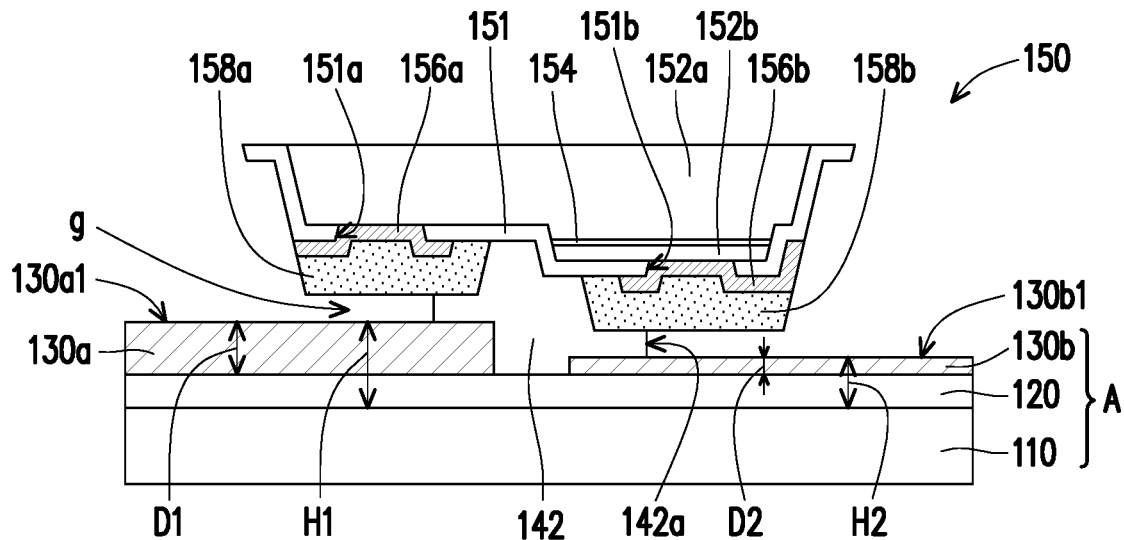
Figure 2C:
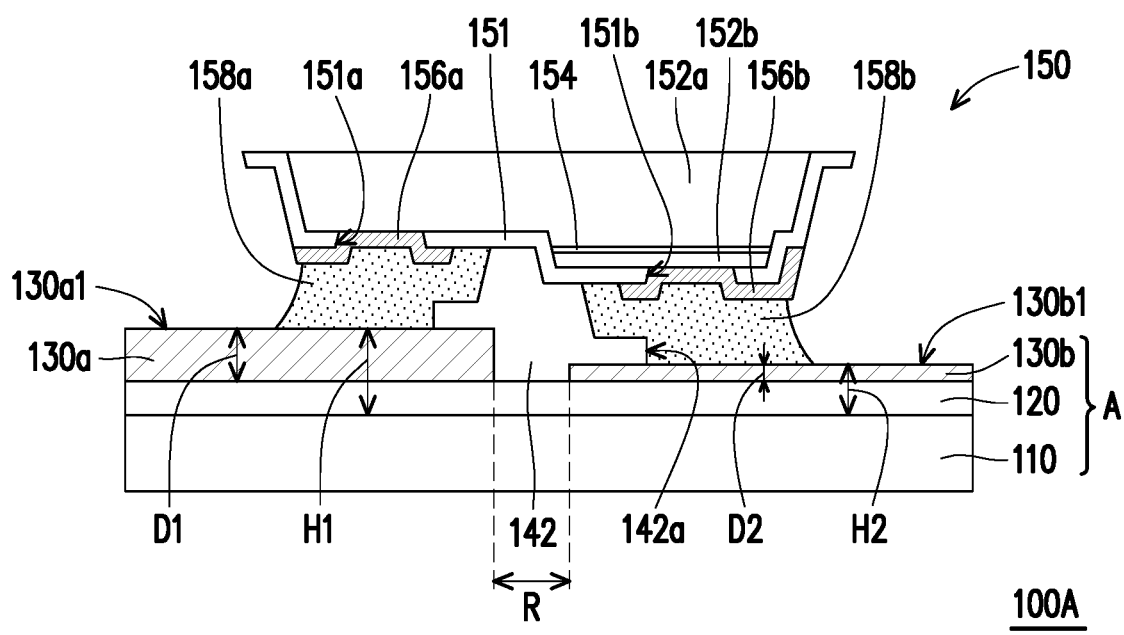

FIG. 2A to FIG. 2C are schematic cross-sectional views showing a manufacturing process of a light-emitting apparatus according to a second embodiment of the present disclosure. The manufacturing process of a light-emitting apparatus 100A of the second embodiment is similar to the manufacturing process of the light-emitting apparatus 100 of the first embodiment, and the main difference between the two is that the manner in which the light-emitting diode elements 150 are disposed on the active device substrate A is different, which will be specifically described with reference to FIG. 2A to FIG. 2C.

Referring to FIG. 2A, first, an active device substrate A is provided. The active device substrate A includes the substrate 110 and the plurality of pads 130a and 130b disposed on the substrate 110. In the present embodiment, a distance H1 between the surface 130a1 of the pad 130a and the substrate 110 may be optionally greater than the distance H2 between the surface 130b1 of the pad 130b and the substrate 110. That is, the thickness D1 of the pad 130a may be greater than the thickness D2 of the pad 130b.

Referring to FIG. 2A, then the sacrificial material layer 140 is formed on the substrate 110 to cover the plurality of pads 130a and 130b. Thereafter, the light-emitting diode element 150 is disposed on the sacrificial material layer 140. The height difference between the plurality of electrodes 156a and 156b of the light-emitting diode element 150 can be compensated by the pads 130a and 130b having different thicknesses. In this manner, the thickness of a portion of the sacrificial material layer 140 sandwiched between the connection pattern 158a and the pad 130a can be substantially equal to the thickness of a portion of the sacrificial material layer 140 sandwiched between the connection pattern 158b and the pad 130b to facilitate subsequent patterning of the sacrificial material layer 140.

Referring to FIG. 2A and FIG. 2B, next, the sacrificial material layer 140 is patterned to form the sacrificial pattern layer 142, and a plurality of gaps g are formed between the plurality of connection patterns 158a and 158b and the plurality of pads 130a and 130b or between the plurality of pads 130a and 130b and the plurality of electrodes 156a and 156b. When in the first model, the plurality of gaps g are formed between the plurality of connection patterns 158a and 158b and the plurality of pads 130a and 130b. When in the second model, the plurality of gaps g are formed between the plurality of pads 130a and 130b and the plurality of electrodes 156a and 156b. Wherein the sacrificial pattern layer 142 exposes at least a portion of each of the plurality of pads 130a and 130b. As shown in FIG. 2A, in the embodiment, since the thickness of the portion of the sacrificial material layer 140 sandwiched between the connection pattern 158a and the pad 130a is substantially equal to the thickness of the portion of the sacrificial material layer 140 sandwiched between the connection pattern 158b and the pad 130b, when the sacrificial material layer 140 is over-etched by using the light-emitting diode element (LED) 150 as a mask, a plurality of gaps g can be easily formed between the connection pattern 158a and the pad 130a and between the connection pattern 158b and the pad 130b without easily occurring undesirable phenomena (for example, but not limited to, a gap g has been formed between the connection pattern 158b and the pad 130b, but a gap g has not been formed between the connection pattern 158a and the pad 130a).

Referring to FIG. 2B and FIG. 2C, a heating process is then performed to make the plurality of connection patterns 158a and 158b become flowable, and the flowable connection patterns 158a and 158b flow downward by gravity, and are respectively electrically connected to the plurality of pads 130a and 130b in the first model. When in the second model, a heating process is then performed to make the plurality of connection patterns 158a and 158b become flowable, and the flowable connection patterns 158a and 158b flow upward by transfer LED's 150 force, and are respectively electrically connected to the plurality of electrodes 156a and 156b. At the present stage, the light-emitting apparatus 100A of the present embodiment is completed.

Referring to FIG. 2C, the light-emitting apparatus 100A of the present embodiment is similar to the light-emitting apparatus 100 of the first embodiment. The main difference between the two is that the electrodes 156a and 156b of the light-emitting diode element 150 are disposed between the active layer 154 of the light-emitting diode element 150 and the sacrificial pattern layer 142. That is, in the present embodiment, the plurality of electrodes 156a and 156b of the light-emitting diode element 150 may optionally face downward. In addition, in the present embodiment, the sacrificial pattern layer 142 not only contacts the connection pattern 142 but also contacts the insulating layer 151 between the plurality of electrodes 156a and 156b of the light-emitting diode element 150.

Figure 3A:
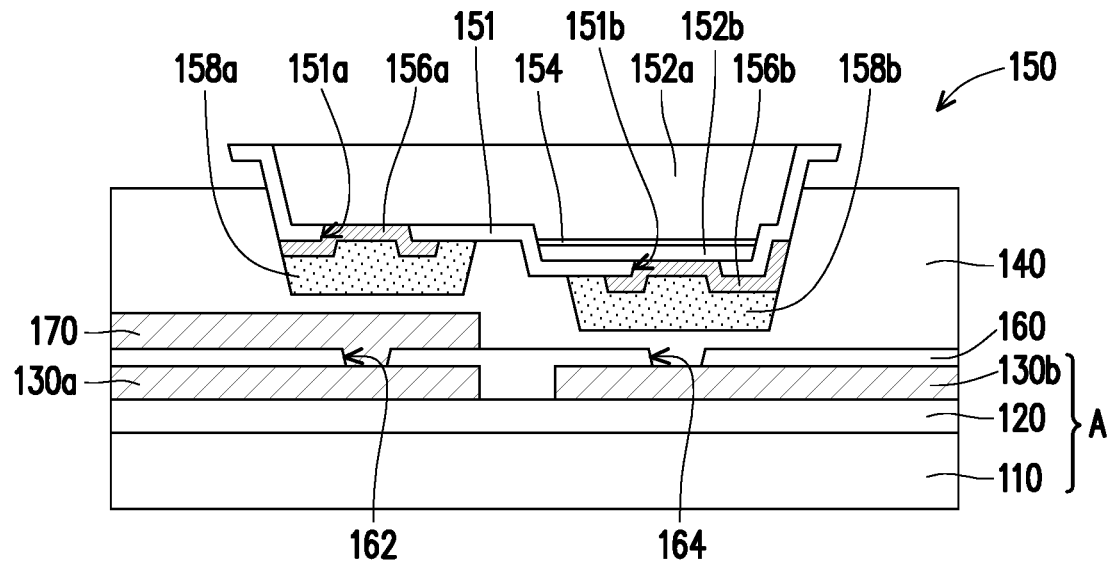
FIG. 3A to FIG. 3C are schematic cross-sectional views showing a manufacturing process of a light-emitting apparatus according to a third embodiment of the present disclosure.
Figure 3B:
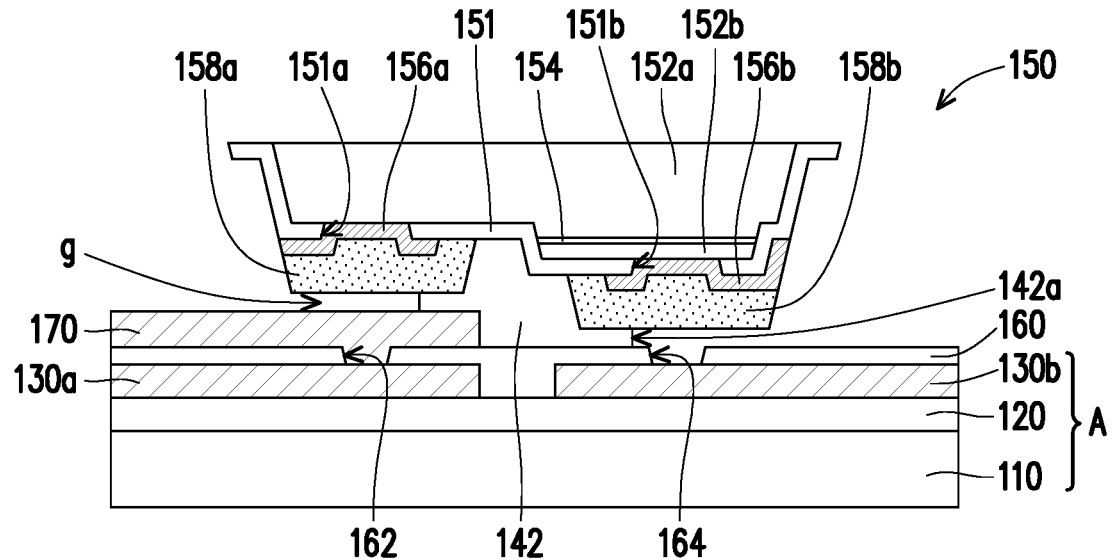
Figure 3C:
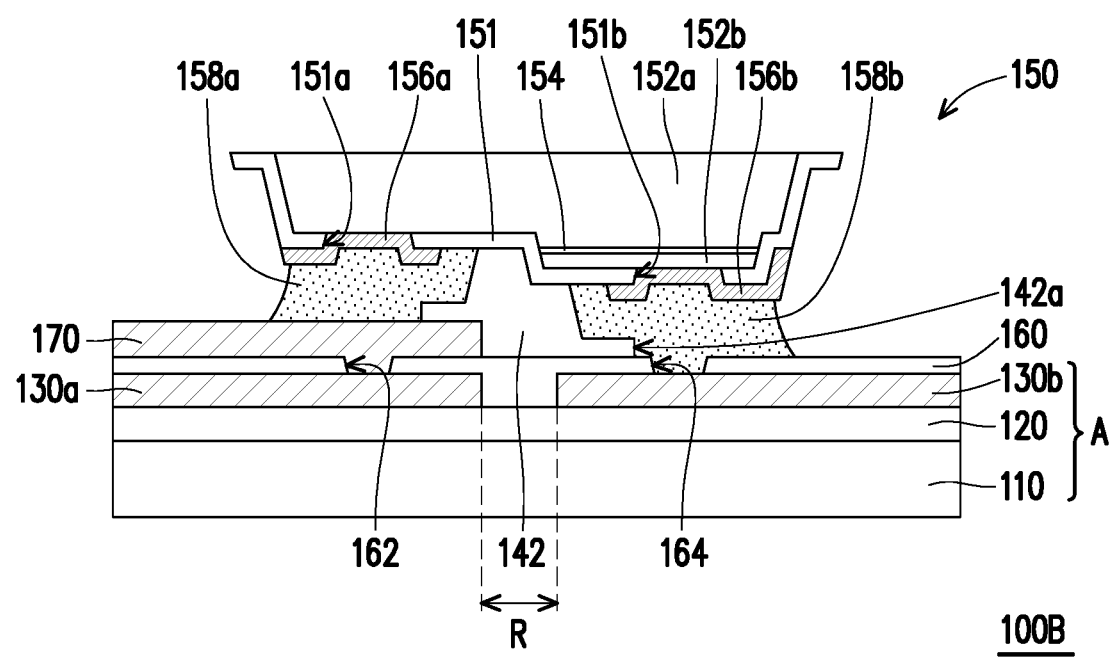

FIG. 3A to FIG. 3C are schematic cross-sectional views showing a manufacturing process of a light-emitting apparatus according to a third embodiment of the present disclosure. The manufacturing process of a light-emitting apparatus 100B of the third embodiment is similar to the manufacturing process of the light-emitting apparatus 100A of the second embodiment, and the main difference between the two is that the manner of compensating for the height difference between the plurality of electrodes 156a and 156b of the light-emitting diode element 150 in the third embodiment is different from the manner of compensating for the height difference between the plurality of electrodes 156a and 156b of the light-emitting diode element 150 in the second embodiment, which will be specifically described below with reference to FIG. 3A to FIG. 3C.

Referring to FIG. 3A, first, the active device substrate A is provided. The active device substrate A includes the substrate 110 and the plurality of pads 130a and 130b disposed on the substrate 110. Different from the second embodiment, the active device substrate A of the present embodiment further includes an auxiliary conductive pattern 170 disposed on the pad 130a and electrically connected to the pad 130a. Specifically, the active device substrate A further includes a first dielectric layer 160. The first dielectric layer 160 is disposed on the plurality of pads 130a and 130b and has a first contact via 162. The auxiliary conductive pattern 170 is disposed on the first dielectric layer 160 and is electrically connected to the pad 130a through the first contact via 162. In addition, the first dielectric layer 160 also has a second contact via 164 that overlaps the pad 130b.

Referring to FIG. 3A, the sacrificial material layer 140 is formed on the substrate 110 to cover the plurality of pads 130a and 130b. In the present embodiment, the sacrificial material layer 140 is disposed on the auxiliary conductive pattern 170 and the first dielectric layer 160, and is disposed above the plurality of pads 130a and 130b. Then, the light-emitting diode element 150 is disposed on the sacrificial material layer 140. The arrangement of the auxiliary conductive pattern 170 can compensate for the height difference between the plurality of electrodes 156a and 156b of the light-emitting diode element 150. That is, the thickness of the portion of the sacrificial material layer 140 sandwiched between the connection pattern 158a and the auxiliary conductive pattern 170 may be substantially equal to the thickness of the portion of the sacrificial material layer 140 sandwiched between the connection pattern 158b and the pad 130b to facilitate subsequent patterning of the sacrificial material layer 140.

Referring to FIG. 3A and FIG. 3B, then the sacrificial material layer 140 is patterned to form the sacrificial pattern layer 142, and the plurality of gaps g are formed between the plurality of connection patterns 158a and 158b of the light-emitting diode element 150 and the auxiliary conductive pattern 170 and the pad 130b, wherein the sacrificial pattern layer 142 exposes the auxiliary conductive patterns 170 and at least a portion of each of and the pads 130b. As shown in FIG. 3A, in the embodiment, since the thickness of the portion of the sacrificial material layer 140 sandwiched between the connection pattern 158a and the auxiliary conductive pattern 170 is substantially equal to the thickness of the portion of the sacrificial material layer 140 between the connection pattern 158b and the pad 130b, when the sacrificial material layer 140 is over-etched by using the light-emitting diode element 150 as a mask, the plurality of gaps g can be easily formed between the connection pattern 158a and the pad 130a and between the connection pattern 158b and the pads 130b without easily occurring undesirable phenomena (for example, but not limited to, a gap g has been formed between the connection pattern 158b and the pad 130b, but a gap g has not been formed between the connection pattern 158a and the pad 130a).

Referring to FIG. 3B and FIG. 3C, then a heating process is performed to make the plurality of connection patterns 158a and 158b flowable, and the flowable connection patterns 158a and 158b flow downward by gravity, and are electrically connected to the auxiliary conductive pattern 170 and the pad 130b respectively. In the present embodiment, the connection pattern 158a including the hot fluidity conductive material is in contact with the auxiliary conductive pattern 170, and the auxiliary conductive pattern 170 can be regarded as a pad. The sacrificial pattern layer 142 is at least disposed in a region R between the auxiliary conductive pattern 170 and the pad 130b. In addition, in the embodiment, the other connection pattern 158b is electrically connected to the second contact via 164 of the first dielectric layer 160 and the pad 130b. At the present stage, the light-emitting apparatus 100B of the present embodiment is completed.

Figure 4A:
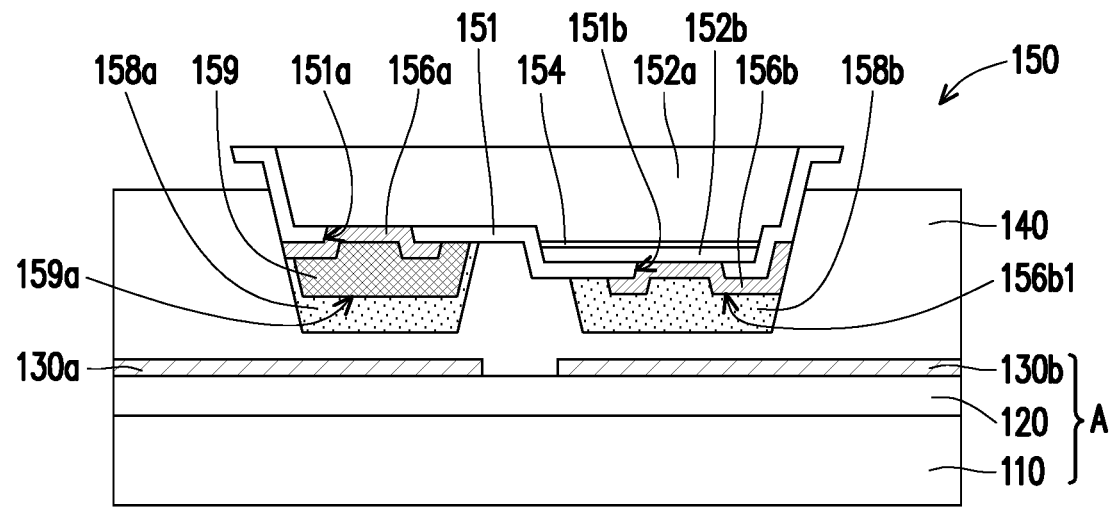
FIG. 4A to FIG. 4C are schematic cross-sectional views showing a manufacturing process of a light-emitting apparatus according to a fourth embodiment of the present disclosure.
Figure 4B:
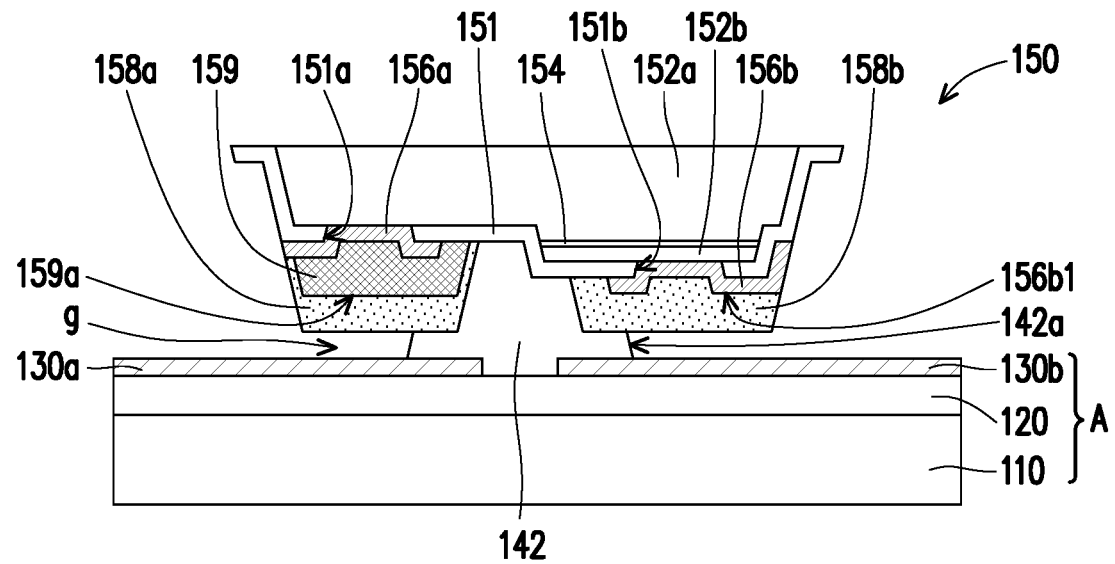
Figure 4C:
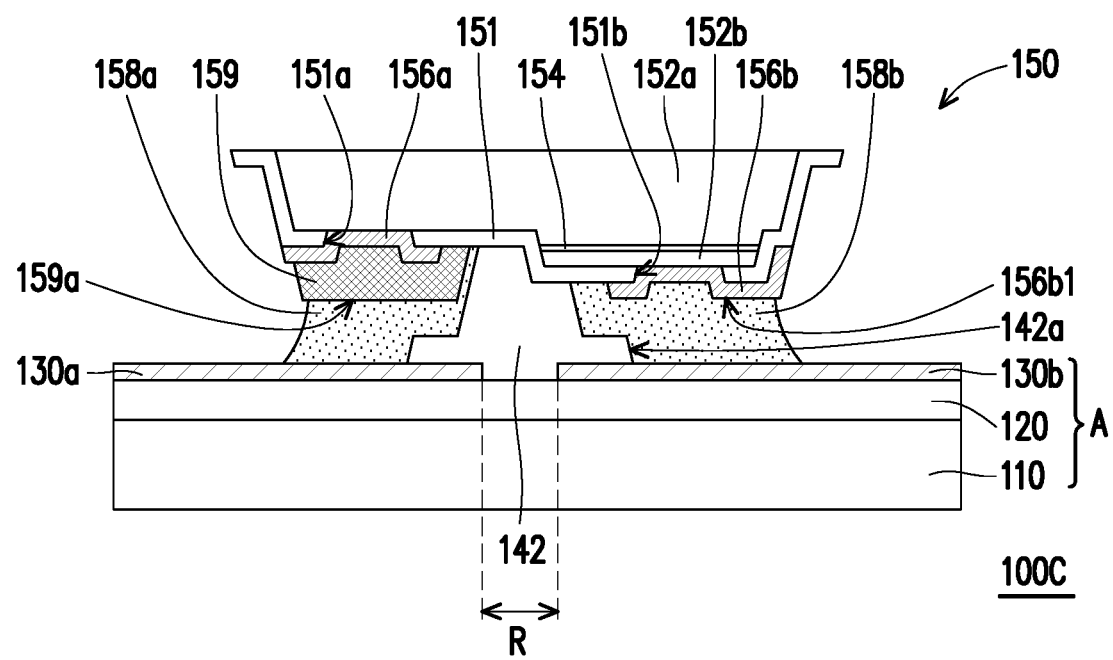

FIG. 4A to FIG. 4C are schematic cross-sectional views showing a manufacturing process of a light-emitting apparatus according to a fourth embodiment of the present disclosure. The manufacturing process of a light-emitting apparatus 100C of the fourth embodiment is similar to the manufacturing process of the light-emitting apparatus 100B of the third embodiment, and the main difference between the two is that the manner of compensating for the height difference between the plurality of electrodes 156a and 156b of the light-emitting diode element 150 in the fourth embodiment is different from the manner of compensating for the height difference between the plurality of electrodes 156a and 156b of the light-emitting diode element 150 in the third embodiment, which will be described below with reference to FIG. 4A to FIG. 4C.

Referring to FIG. 4A, first, the active device substrate A is provided. The active device substrate A includes the substrate 110 and the plurality of pads 130a and 130b disposed on the substrate 110. Unlike the third embodiment, the active device substrate A of the present embodiment does not include the auxiliary conductive pattern 170.

Referring to FIG. 4A, the sacrificial material layer 140 is formed on the substrate 110 to cover the plurality of pads 130a and 130b. Then, the light-emitting diode element 150 is disposed on the sacrificial material layer 140. Different from the third embodiment, the light-emitting diode element 150 of the present embodiment is different from the light-emitting diode element 150 of the third embodiment. Specifically, the light-emitting diode element 150 of the present embodiment further includes an auxiliary electrode 159 disposed on one of the electrodes 156a of the light-emitting diode element 150 and electrically connected to the electrode 156a. When the light-emitting diode element 150 is disposed on the sacrificial material layer 140, the surface 159a of the pad 130a of the auxiliary electrode 159 facing the active device substrate A can be substantially coplanar with the surface 156b1 of the pad 130b of the other electrode 156b facing of the active device substrate A. The connection pattern 158a and the connection pattern 158b are respectively disposed on the surface 159a of the auxiliary electrode 159 and the surface 156b1 of the electrode 156b, and are electrically connected to the auxiliary electrode 159 and the electrode 156b, respectively. Since the connection pattern 158a is disposed on the auxiliary electrode 159 for compensating for the height difference between the electrodes 156a and 156b, the thickness of the portion of the sacrificial material layer 140 sandwiched between the connection pattern 158a and the pad 130a can be substantially equal to the thickness of the portion of the sacrificial material layer 140 between the connection pattern 158b and the pad 130b to facilitate subsequent patterning of the sacrificial material layer 140.

Referring to FIG. 4A and FIG. 4B, next, the sacrificial material layer 140 is patterned to form the sacrificial pattern layer 142, and the plurality of gaps g are formed between the plurality of connection patterns 158a and 158b of the light-emitting diode element 150 and the plurality of pads 130a and 130b, wherein the sacrificial pattern layer 142 exposes at least a portion of each of the plurality of pads 130a and 130b. As shown in FIG. 4A, in the present embodiment, the auxiliary electrode 159 of the light-emitting diode element 150 compensates for the height difference between the electrode 156a and the electrode 156b, such that the thickness of the portion of the sacrificial material layer 140 sandwiched between the connection pattern 158a and the pad 130a is substantially equal to the thickness of the portion of the sacrificial material layer 140 sandwiched between the connection pattern 158b and the pad 130b. Therefore, when the sacrificial material layer 140 is over-etched by using the light-emitting diode element 150 as a mask, the plurality of gaps g can be easily formed between the connection pattern 158a and the pad 130a and between the connection pattern 158b and the pad 130b without easily occurring undesirable phenomena (for example, but not limited to, a gap g has been formed between the connection pattern 158b and the pad 130b, but a gap g has not been formed between the connection pattern 158a and the pad 130a).

Referring to FIG. 4B and FIG. 4C, then a heating process is performed to make the plurality of connection patterns 158a and 158b become flowable, and the flowable connection patterns 158a and 158b flow downward by gravity, and are electrically connected to the plurality of pads 130a and 130b respectively. At the present stage, the light-emitting apparatus 100C of the present embodiment is completed. In some embodiment, a distance between a surface of one of the pads 130a and 130b in contact with one of the connection patterns 158a and 158b and the substrate 110 is substantially equal to a distance between a surface of another of the pads 130a and 130b in contact with another of the connection patterns 158a and 158b and the substrate 110.

The first to fourth embodiments describe the manufacturing process of one pixel of the light-emitting apparatuses 100, 100A to 100C as an example. Those having ordinary skill in the art should be able to understand that the manufacturing process of the one pixel can be used to simultaneously manufacture a plurality of pixels, which will be exemplified below with reference to FIG. 5A to FIG. 5C and FIG. 6.

Figure 5A:
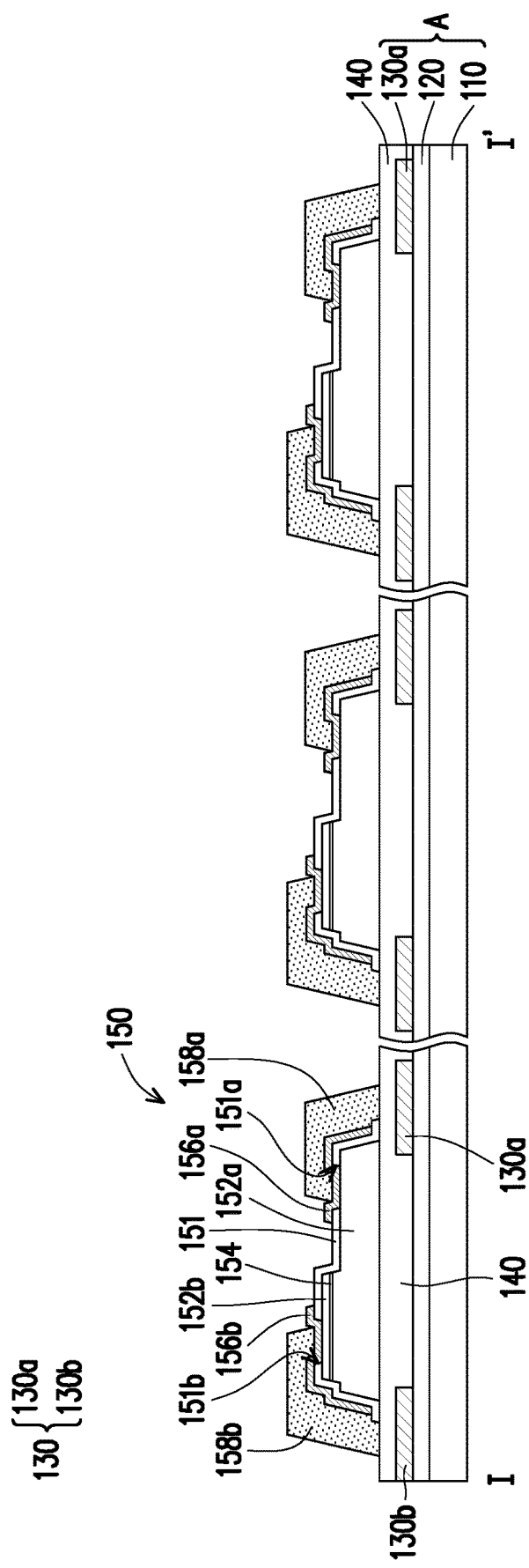
FIG. 5A to FIG. 5C are schematic cross-sectional views showing a manufacturing process of a light-emitting apparatus according to a fifth embodiment of the present disclosure.
Figure 5B:
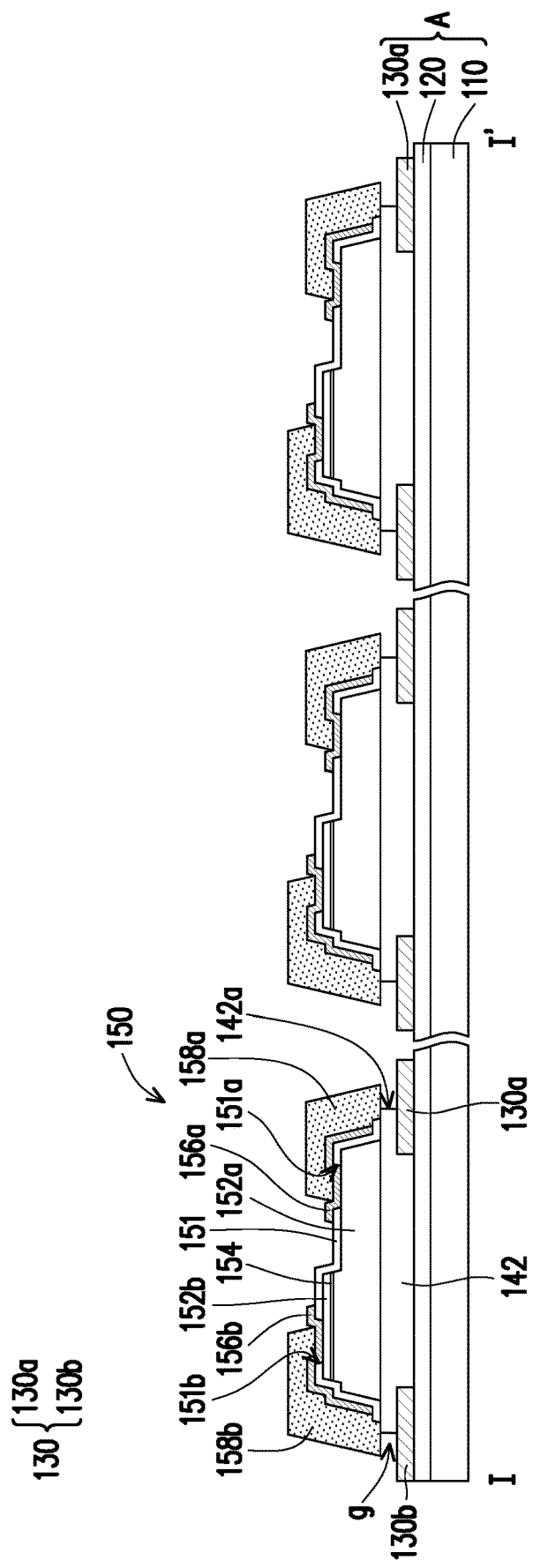
Figure 5C:
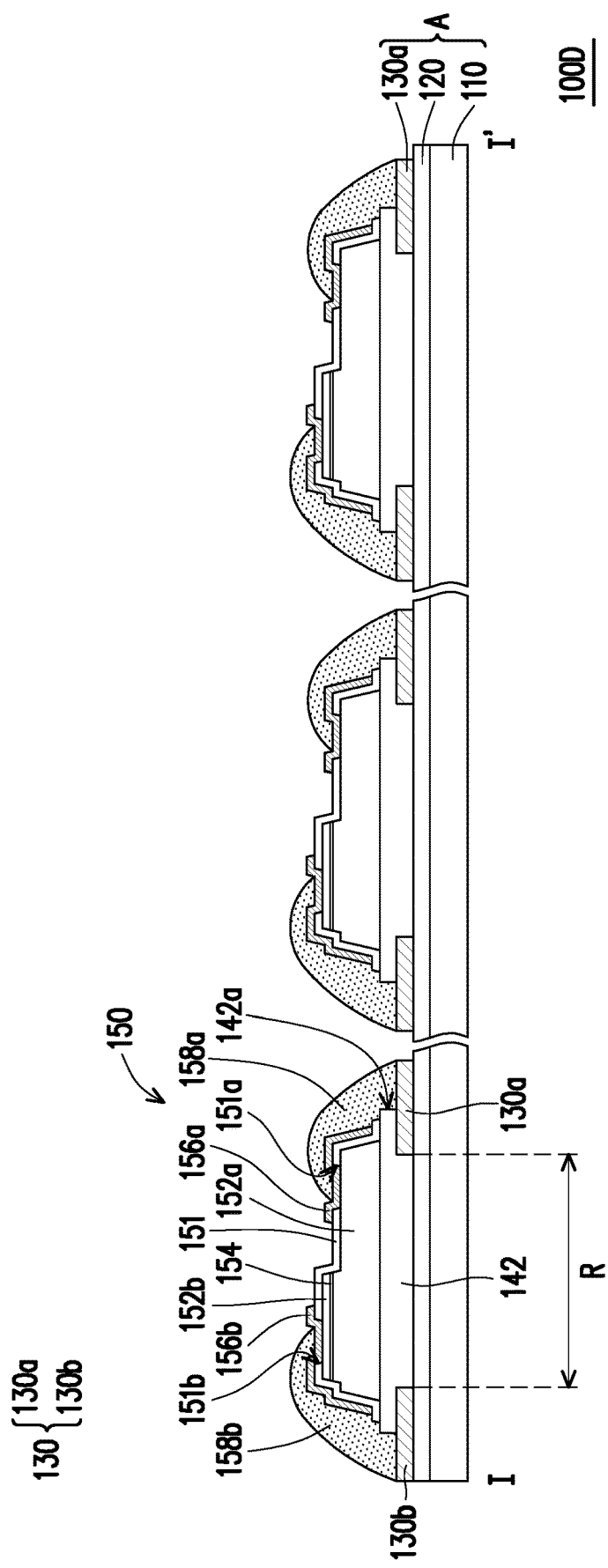
Figure 6:
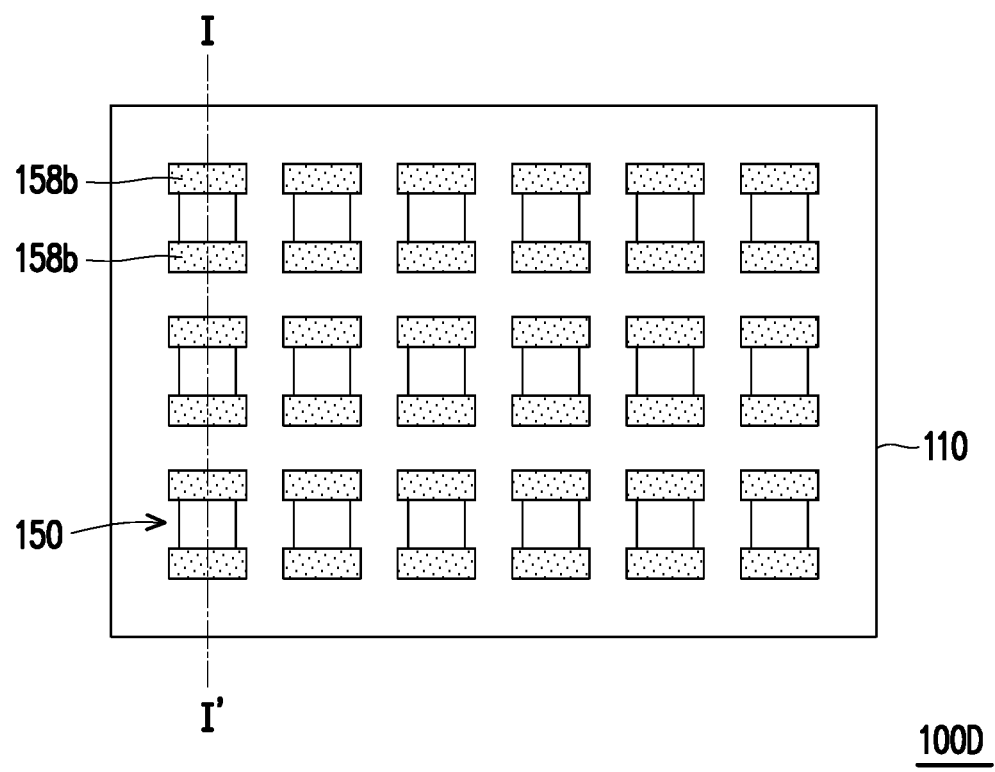
FIG. 6 is a schematic top view showing a light-emitting apparatus according to a fifth embodiment of the present disclosure.

FIG. 5A to FIG. 5C are schematic cross-sectional views showing a manufacturing process of a light-emitting apparatus according to a fifth embodiment of the present disclosure. FIG. 6 is a schematic top view showing a light-emitting apparatus according to a fifth embodiment of the present disclosure. FIG. 5C corresponds to the cross-sectional line I-I' taken from FIG. 6. FIG. 6 depicts the substrate 110 and the light-emitting diode element 150 of FIG. 5C, while the other components of FIG. 5C are omitted.

Referring to FIG. 5A, first, the active device substrate A is provided. The active device substrate A includes the substrate 110 and a plurality of pad sets 130 disposed on the substrate 110. Each pad set 130 includes the plurality of pads 130a and 130b. Next, the sacrificial material layer 140 is formed on the substrate 110 to cover the plurality of pad sets 130. Then, the plurality of light-emitting diode elements 150 are disposed on the sacrificial material layer 140. The plurality of light-emitting diode elements 150 are bonded to the active device substrate A through the sacrificial material layer 140.

Referring to FIG. 5A and FIG. 5B, next, the sacrificial material layer 140 is patterned to form the sacrificial pattern layer 142, and the plurality of gaps g are formed between the plurality of connection patterns 158a and 158b and the plurality of pads 130a and 130b, wherein the sacrificial pattern layer 142 exposes at least a portion of each of the plurality of pads 130a and 130b.

Referring to FIG. 5B, FIG. 5C FIG. 6, then a heating process is performed to make the plurality of connection patterns 158a and 158b of the plurality of light-emitting diode elements 150 become flowable, and the flowable connection patterns 158a and 158b flow downward by gravity, and are electrically connected to the plurality of pads 130a and 130b respectively. At the present stage, the light-emitting apparatus 100D of the present embodiment is completed.

The first to the fifth embodiments describe the fabrication of the light-emitting apparatuses 100, 100A to 100D directly by using the connection patterns 158a and 158b including the hot fluidity conductive material. However, the present disclosure is not limited thereto, and the light-emitting diode element 150 of the connection patterns 158a and 158b including the hot fluidity conductive material may also be used to repair the completed light-emitting apparatus, which will be exemplified with reference to FIG. 7A to FIG. 7F, FIG. 8A to FIG. 8F, FIG. 9A to FIG. 9F and FIG. 10A to FIG. 10F.

FIG. 7A to FIG. 7F are schematic cross-sectional views showing a manufacturing process of a light-emitting apparatus according to a sixth embodiment of the present disclosure. FIG. 8A to FIG. 8F are schematic top views showing a manufacturing process of a light-emitting apparatus according to a sixth embodiment of the present disclosure. FIG. 8A to FIG. 8F correspond to the cross-sectional lines I-I' and II-II' taken from FIG. 7A to FIG. 7F, respectively. FIG. 8A to FIG. 8F illustrate the light-emitting diode element 150, the interconnection patterns 182 and 184, and the substrate 110 of FIG. 7A to FIG. 7F, and other components in FIG. 7A to FIG. 7F are omitted.

Figure 7A:
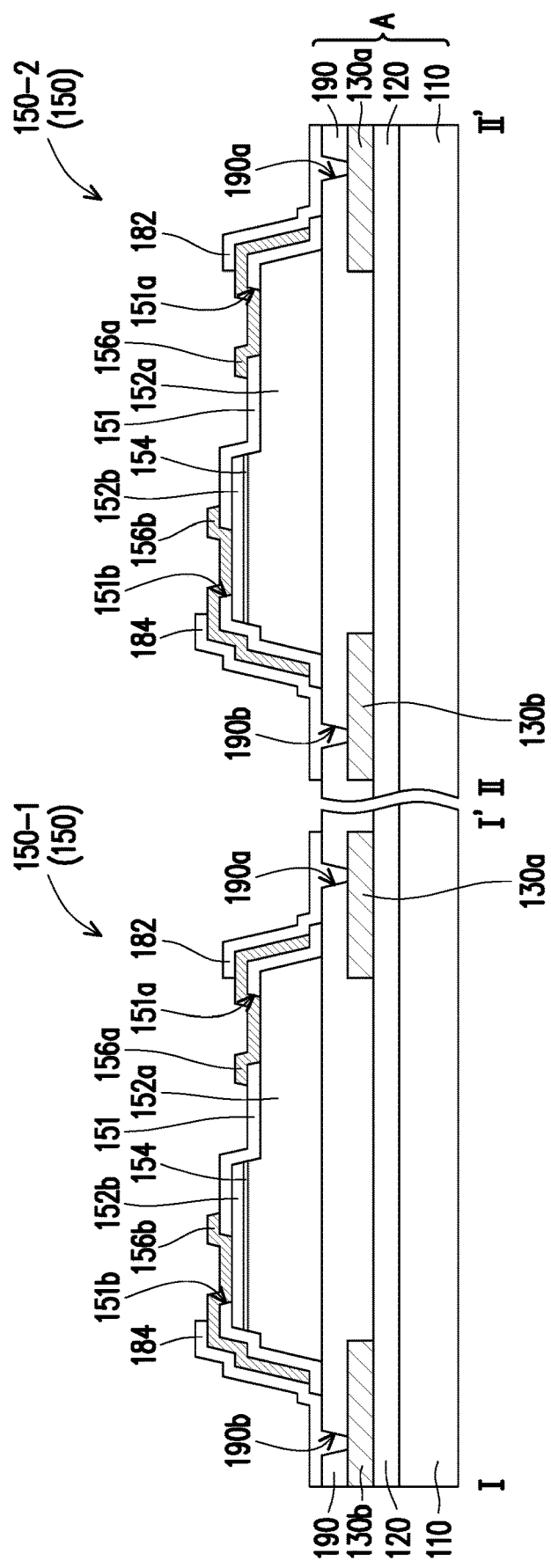
FIG. 7A to FIG. 7F are schematic cross-sectional views showing a manufacturing process of a light-emitting apparatus according to a sixth embodiment of the present disclosure.
Figure 8A:
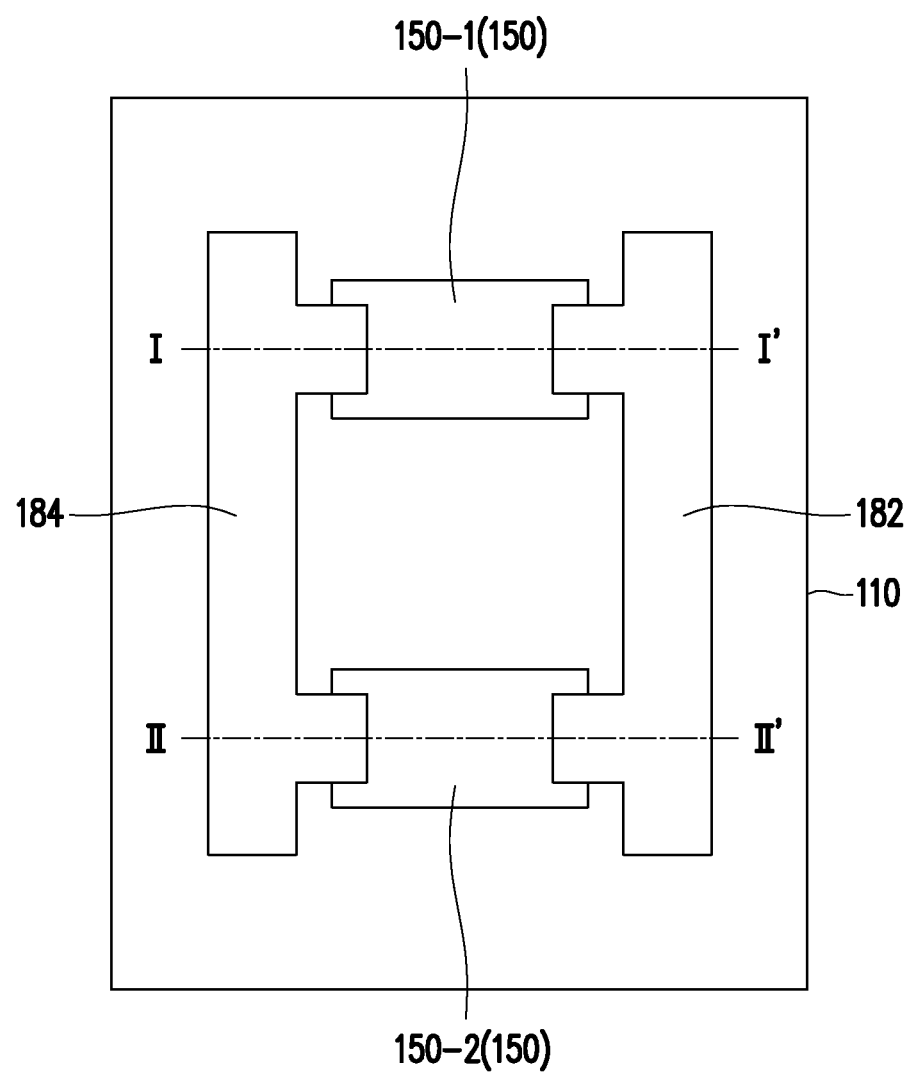
FIG. 8A to FIG. 8F are schematic top views showing a manufacturing process of a light-emitting apparatus according to a sixth embodiment of the present disclosure.

Referring to FIG. 7A and FIG. 8A, FIG. 7A and FIG. 8A illustrate a light-emitting apparatus manufactured by a conventional method. Specifically, a light-emitting apparatus that has been completed by using a conventional method includes an active device substrate A, a plurality of light-emitting diode elements 150-1 and 150-2, and a plurality of interconnection patterns 182 and 184.

Figure 7B:
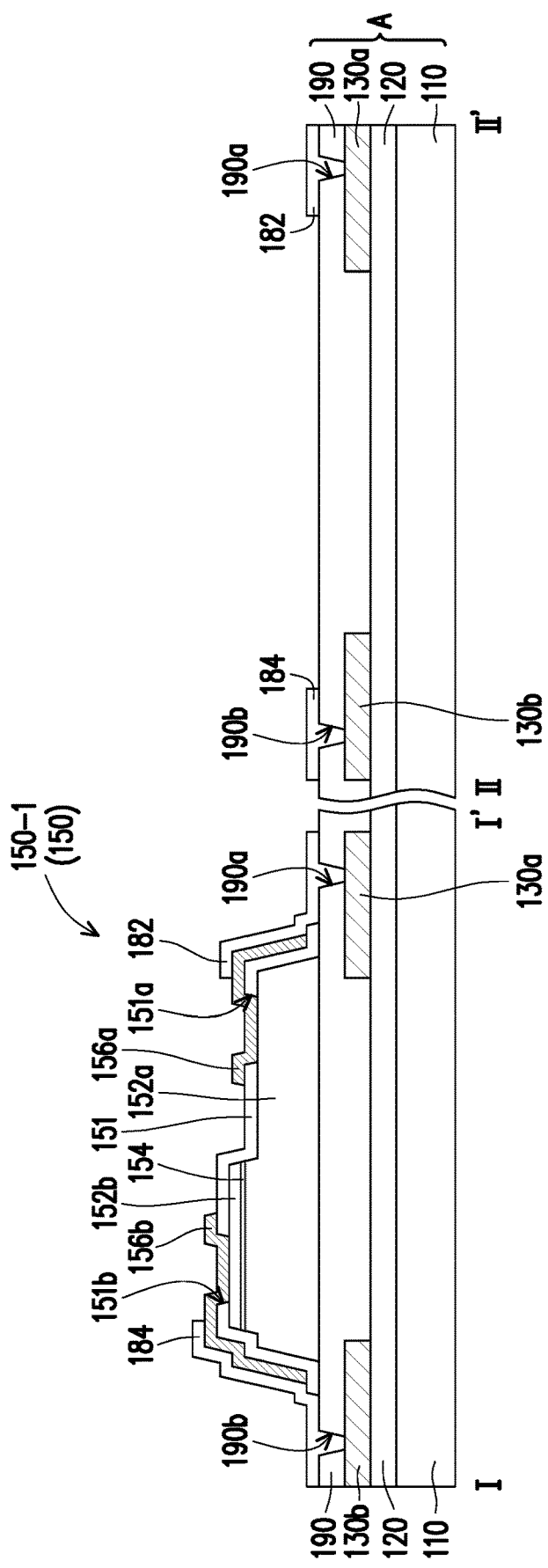
Figure 8B:
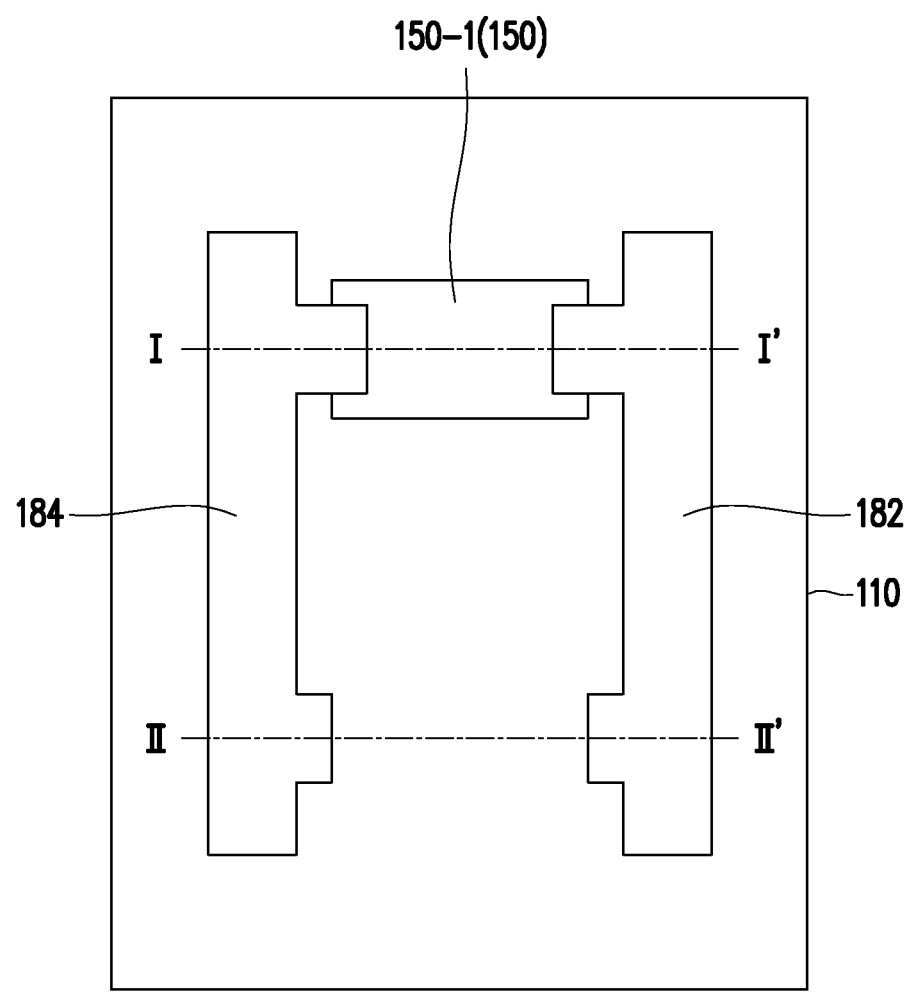

Referring to FIG. 7A and FIG. 8A, after the light-emitting apparatus has been completed by the conventional method, then the light-emitting apparatus is detected, and it is found that the light-emitting diode element 150-2 is abnormal and/or the electrical connection with the active device substrate A is poor. Referring to FIG. 7A, FIG. 7B, FIG. 8A, and FIG. 8B, thereafter the light-emitting diode element 150-2 is removed. When the light-emitting diode element 150-2 is removed, a portion of the interconnection pattern 182 disposed on the light-emitting diode element 150-2 and a portion of the interconnection pattern 184 disposed on the light-emitting diode element 150-2 are removed along with the light-emitting diode element 150-2, and another portion of the interconnection pattern 182 disposed on the second dielectric layer 190 and another portion of the interconnection pattern 184 disposed on the second dielectric layer 190 are left on the substrate 110 as shown in FIG. 7B and FIG. 8B.

Figure 7C:
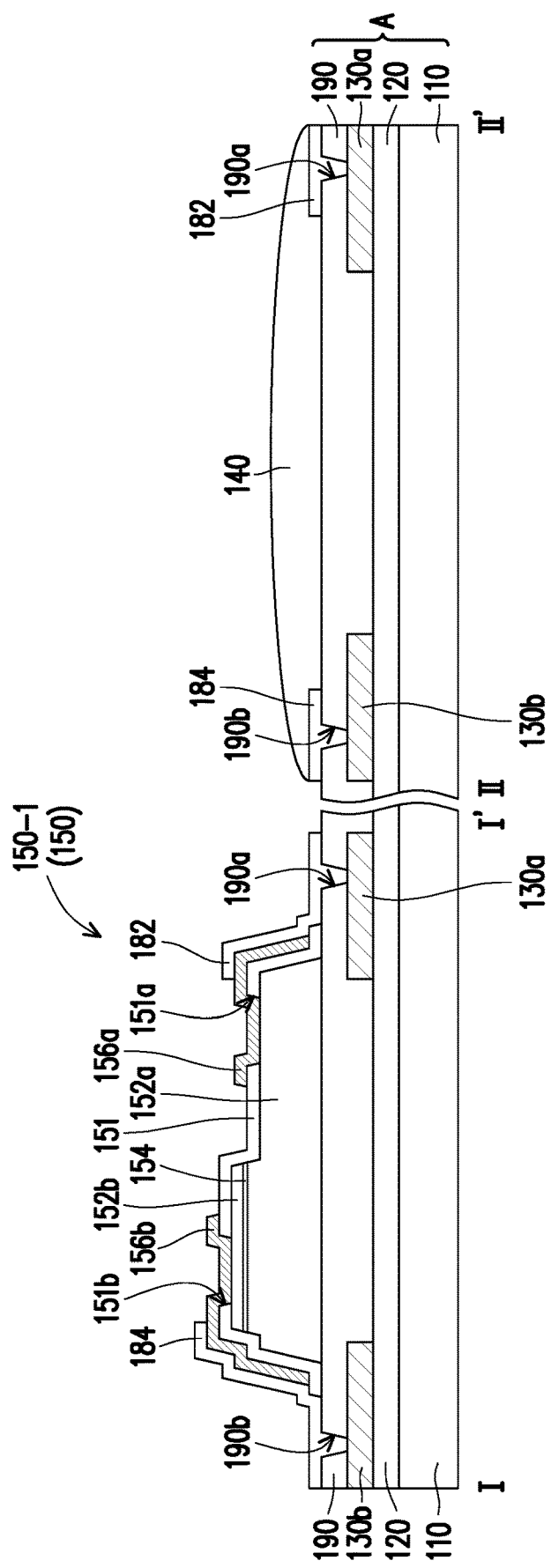
Figure 8C:
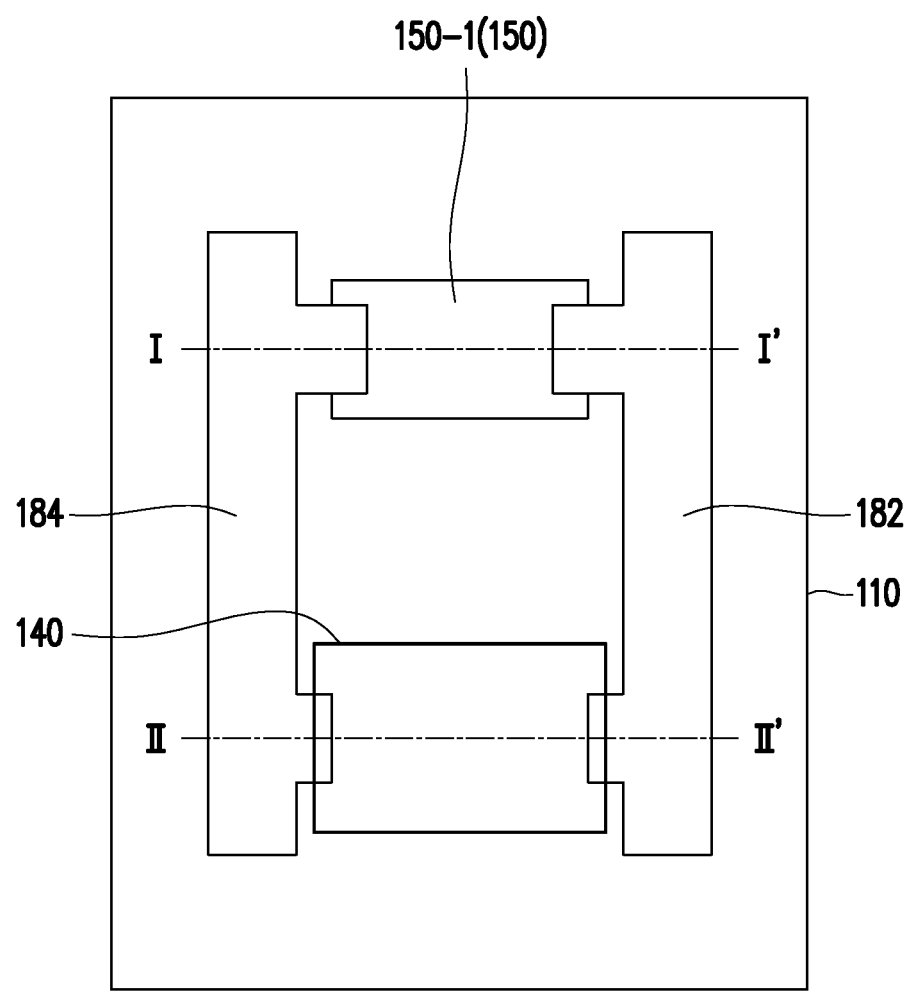

Referring to FIG. 7C and FIG. 8C, next, the sacrificial material layer 140 is formed on the substrate 110 to cover the plurality of pads 130a and 130b. In this embodiment, the sacrificial material layer 140 is formed on a portion of the second dielectric layer 190 overlapping the original light-emitting diode element 150-2 and the partial interconnection pattern 182 and the partial interconnection pattern 184 on both sides of the light-emitting diode element 150-2.

Figure 7D:
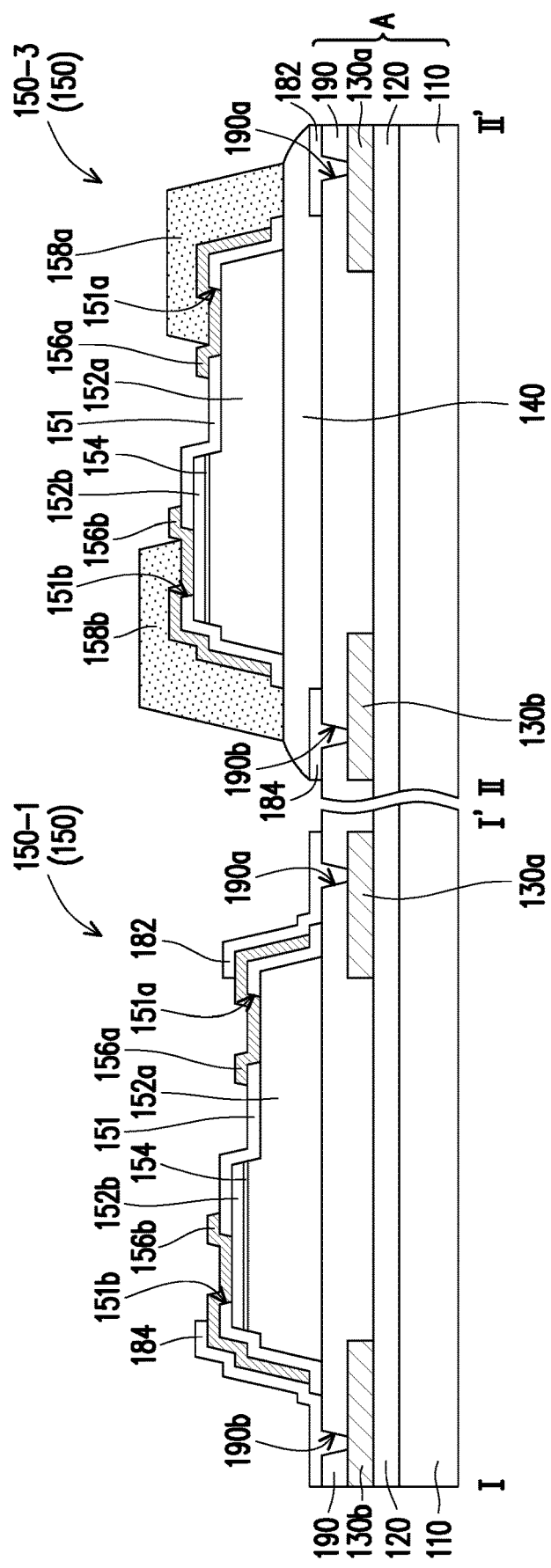
Figure 7E:
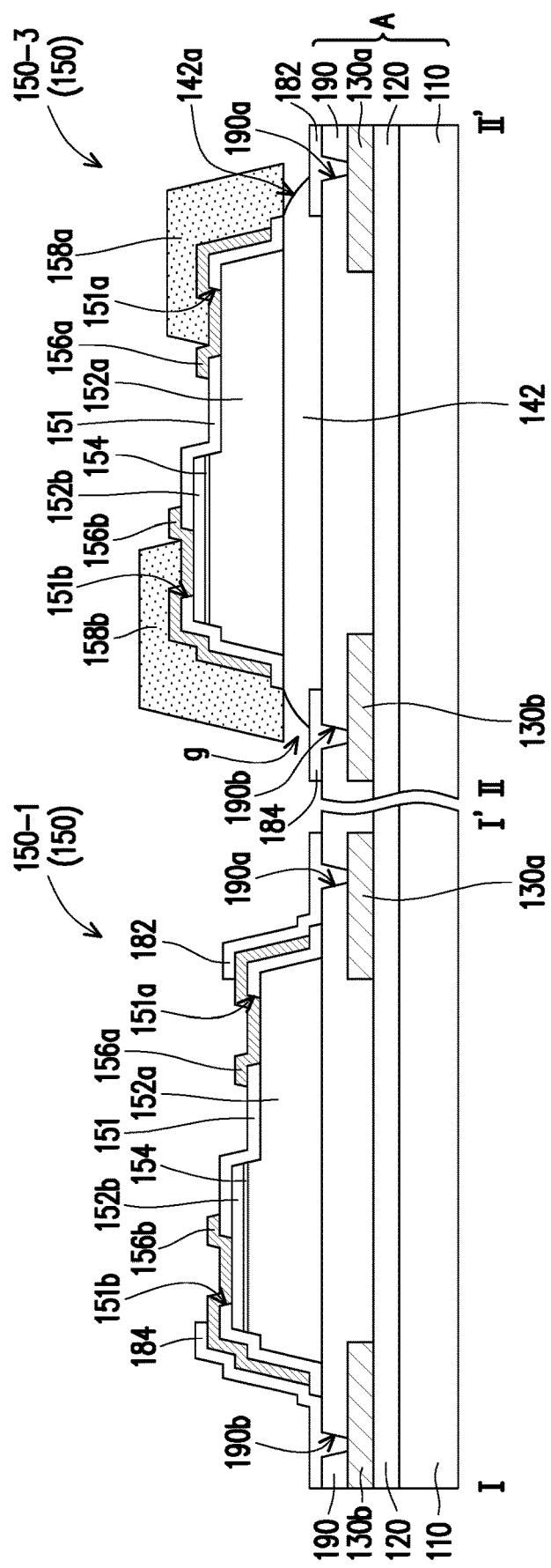
Figure 8D:
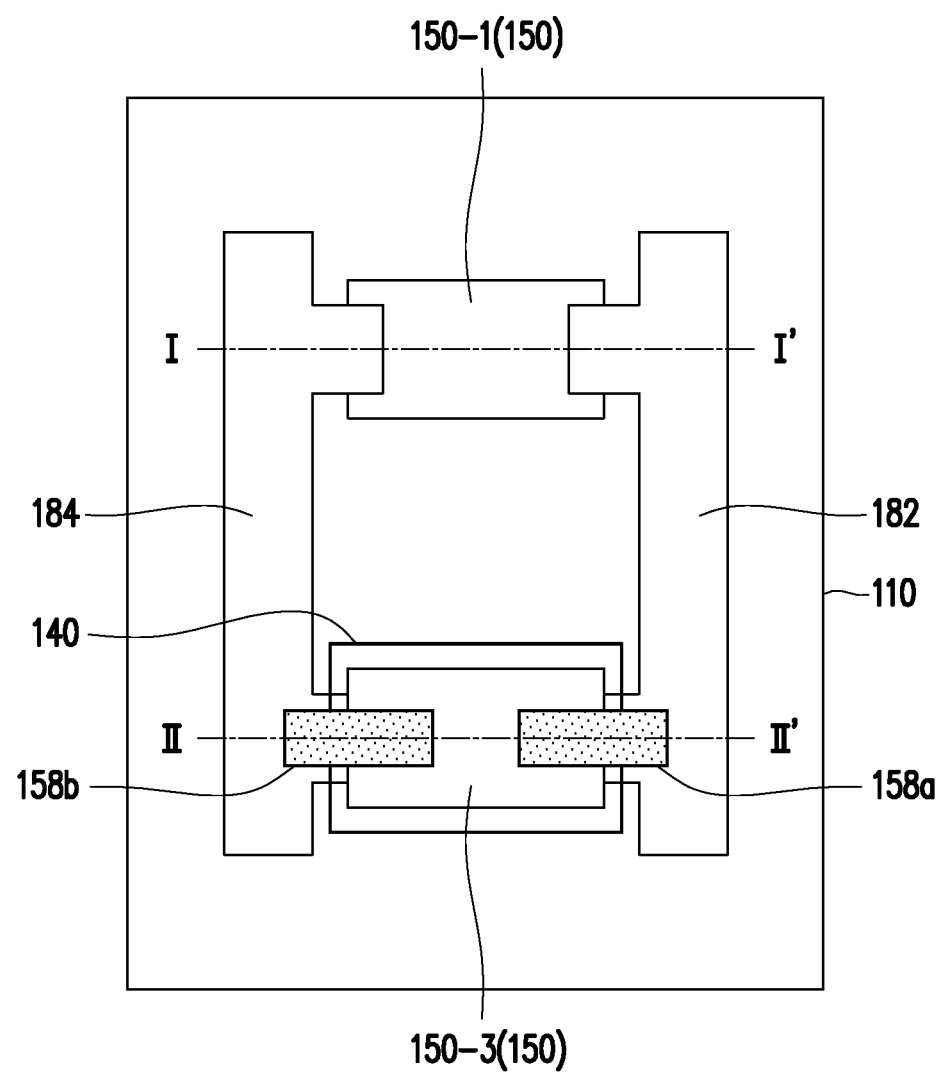
Figure 8E:
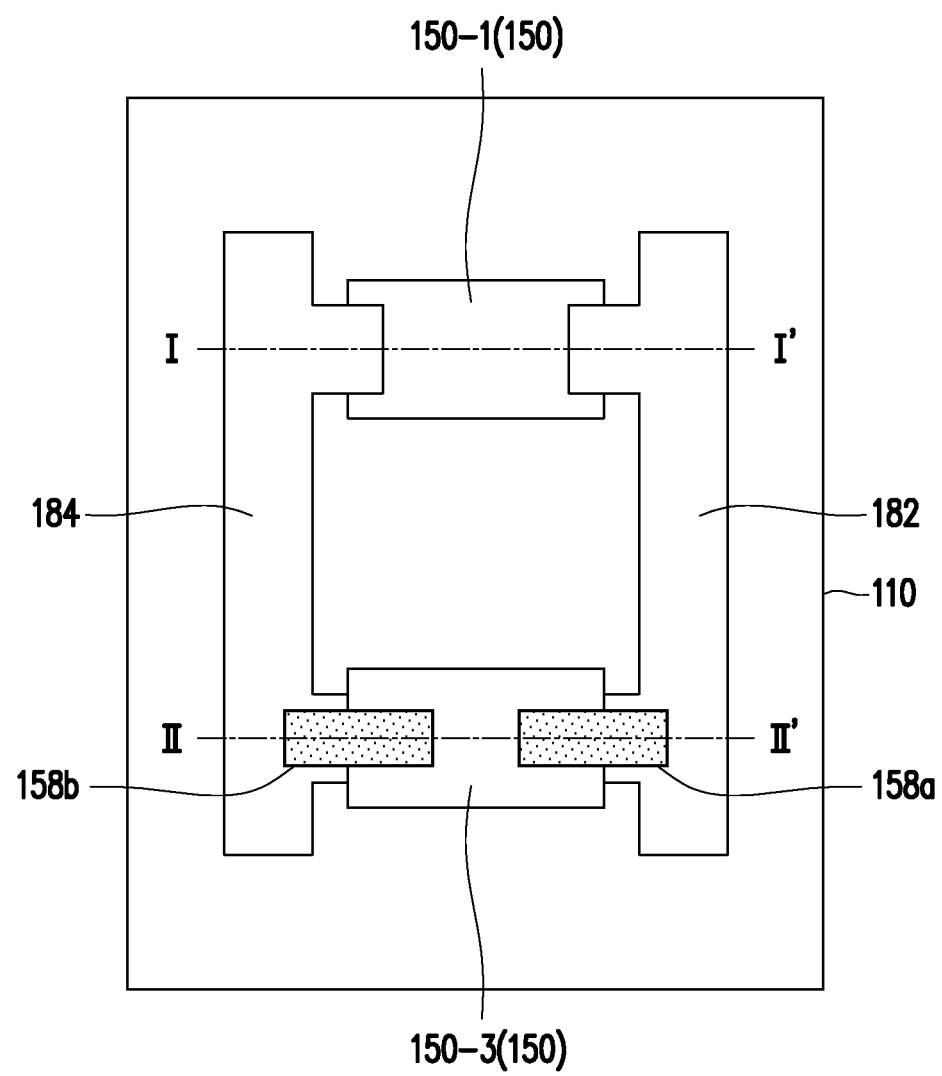

Referring to FIG. 7D and FIG. 8D, next, the light-emitting diode element 150-3 is disposed on the sacrificial material layer 140. The light-emitting diode element 150-3 is bonded to the active device substrate A through the sacrificial material layer 140. The light-emitting diode element 150-3 also includes the plurality of connection patterns 158a and 158b.

Referring to FIG. 7D, FIG. 7E, FIG. 8D, and FIG. 8E, then the sacrificial material layer 140 is patterned to form the sacrificial pattern layer 142, and the plurality of gaps g are formed between the plurality of connection patterns 158a and 158b of the light-emitting diode element 150 and the partial interconnection patterns 182 and 184, wherein the sacrificial pattern layer 142 exposes at least a portion of each of the partial interconnection patterns 182 and 184. For example, in the embodiment, the sacrificial material layer 140 is over-etched by using the light-emitting diode element 150-3 as a mask to form the sacrificial pattern layer 142. When the sacrificial material layer 140 is subjected to an over-etching process, there are the plurality of gaps g between the sidewall 142a of the sacrificial pattern layer 142 and the interconnection patterns 182 and 184.

Figure 7F:
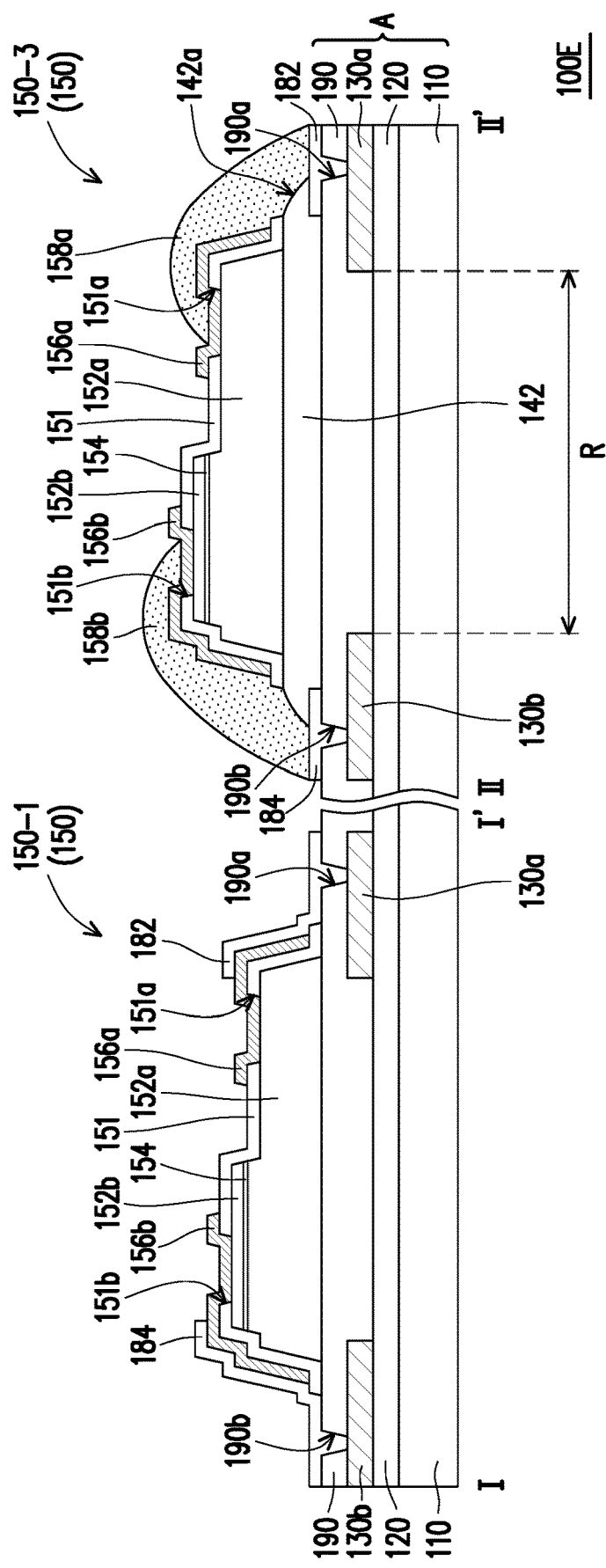
Figure 8F:
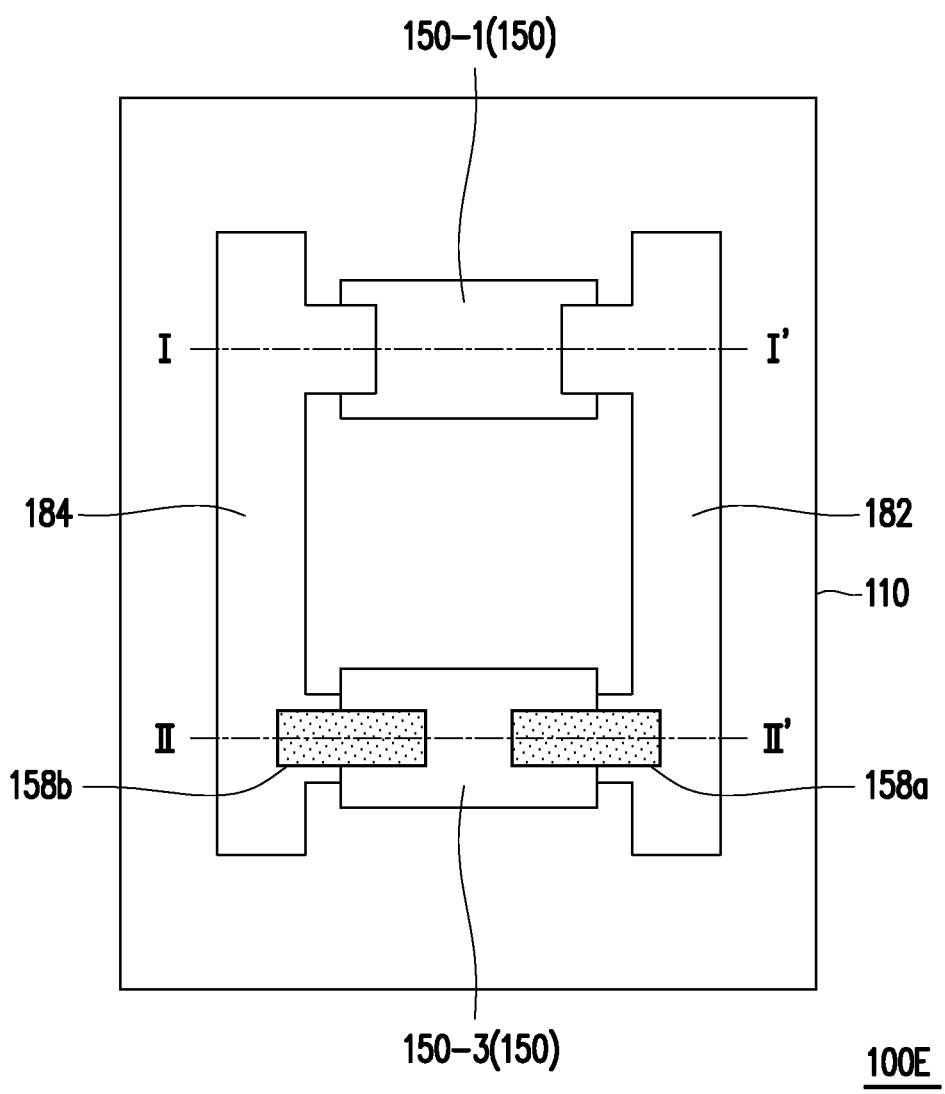

Referring to FIG. 7F and FIG. 8F, next, a heating process is performed to make the plurality of connection patterns 158a and 158b become flowable, and the flowable connection patterns 158a and 158b flow downward by gravity, and are electrically connected to the interconnection patterns 182 and 184 respectively remained on the substrate 110. In the present embodiment, the connection patterns 158a and 158b of the light-emitting diode element 150-3 are in contact with and electrically connected to the interconnection patterns 182 and 184. The interconnection patterns 182 and 184 can also be regarded as pads. The sacrificial pattern layer 142 is at least disposed in a region R between the interconnection pattern 182 and the interconnection pattern 184. The connection patterns 158a and 158b of the light-emitting diode element 150-3 are electrically connected to the pads 130a and 130b through the interconnection patterns 182 and 184. At the present stage, the repaired light-emitting apparatus 100E is completed.

It should be noted that in the present embodiment, the electrode 156b of the light-emitting diode element 150-1 and the electrode 156b of the light-emitting diode element 150-3 for repair are electrically connected to each other. That is to say, the normal light-emitting diode element 150-1 and the light-emitting diode element 150-3 for repair belong to the same pixel. However, the present disclosure is not limited thereto, and according to other embodiments, the electrode 156b of the normal light-emitting diode element 150-1 and the electrode 156b of the light-emitting diode element 150-3 for repair are also electrically independent from each other; that is, the normal light-emitting diode element 150-1 and the light-emitting diode element 150-3 for repair may also belong to different pixels.

As shown in FIG. 7F and FIG. 8F, in the present embodiment, the light-emitting diode element 150-3 for replacing the original light-emitting diode element 150-2 is disposed at the position where the original light-emitting diode element 150-2 is disposed. That is, in the present embodiment, the new light-emitting diode element 150-3 overlaps the pads 130a and 130b. However, the present disclosure is not limited thereto. In other embodiments, the light-emitting diode element 150-3 for replacing the original light-emitting diode element 150-2 may not be disposed at the position where the original light-emitting diode element 150-2 is disposed, which will be exemplified below with reference to FIG. 9A to FIG. 9F and FIG. 10A to FIG. 10F.

FIG. 9A to FIG. 9F are schematic cross-sectional views showing a manufacturing process of a light-emitting apparatus according to a seventh embodiment of the present disclosure. FIG. 10A to FIG. 10F are schematic top views showing a manufacturing process of a light-emitting apparatus according to a seventh embodiment of the present disclosure. FIG. 9A to FIG. 9F correspond to the cross-sectional lines I-I' and II-II' taken from FIG. 10A to FIG. 10F, respectively. FIG. 10A to FIG. 10F illustrate the light-emitting diode element 150, the interconnection patterns 182 and 184, and the substrate 110 in FIG. 9A to FIG. 9F, while other components in FIG. 9A to FIG. 9F are omitted.

Figure 9A:
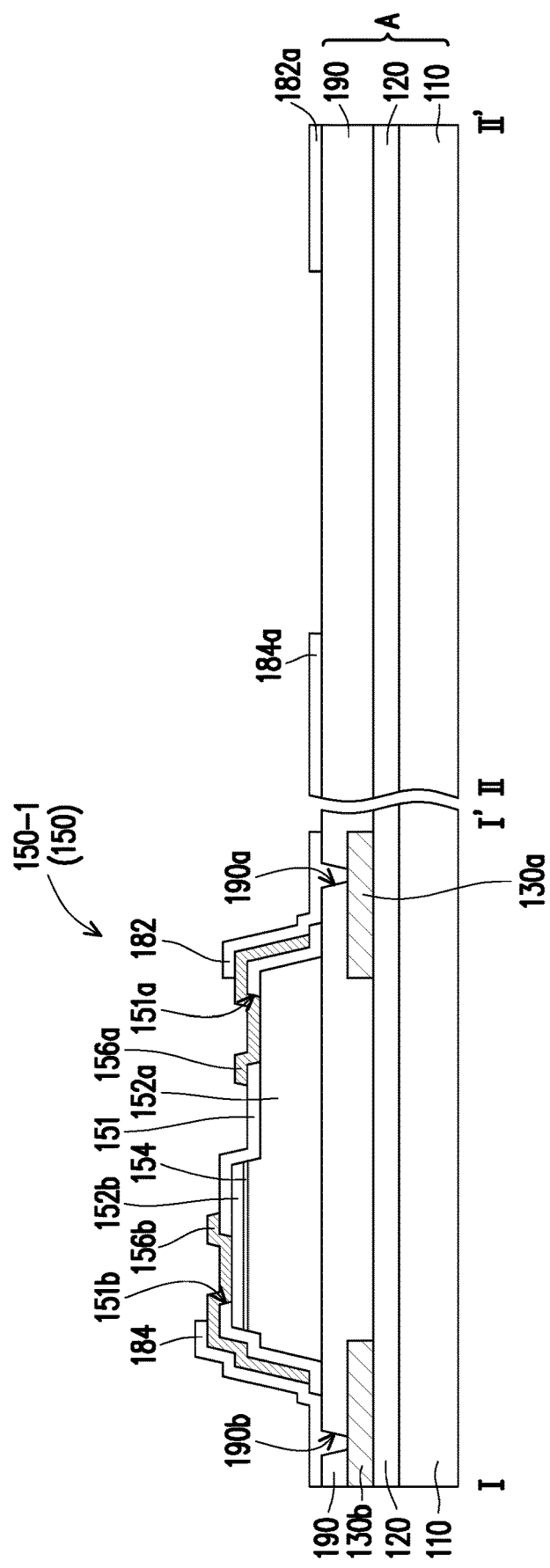
FIG. 9A to FIG. 9F are schematic cross-sectional views showing a manufacturing process of a light-emitting apparatus according to a seventh embodiment of the present disclosure.
Figure 9B:
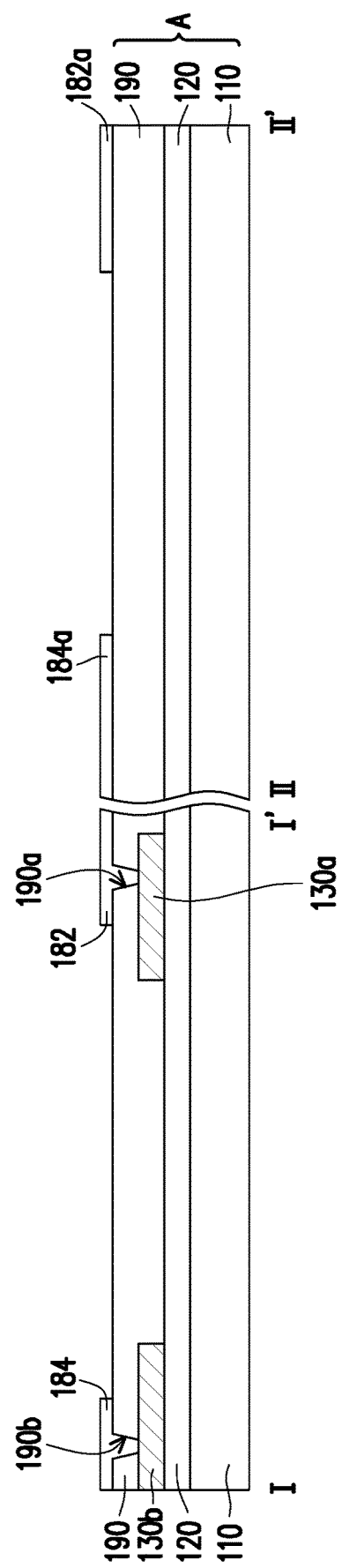
Figure 10A:
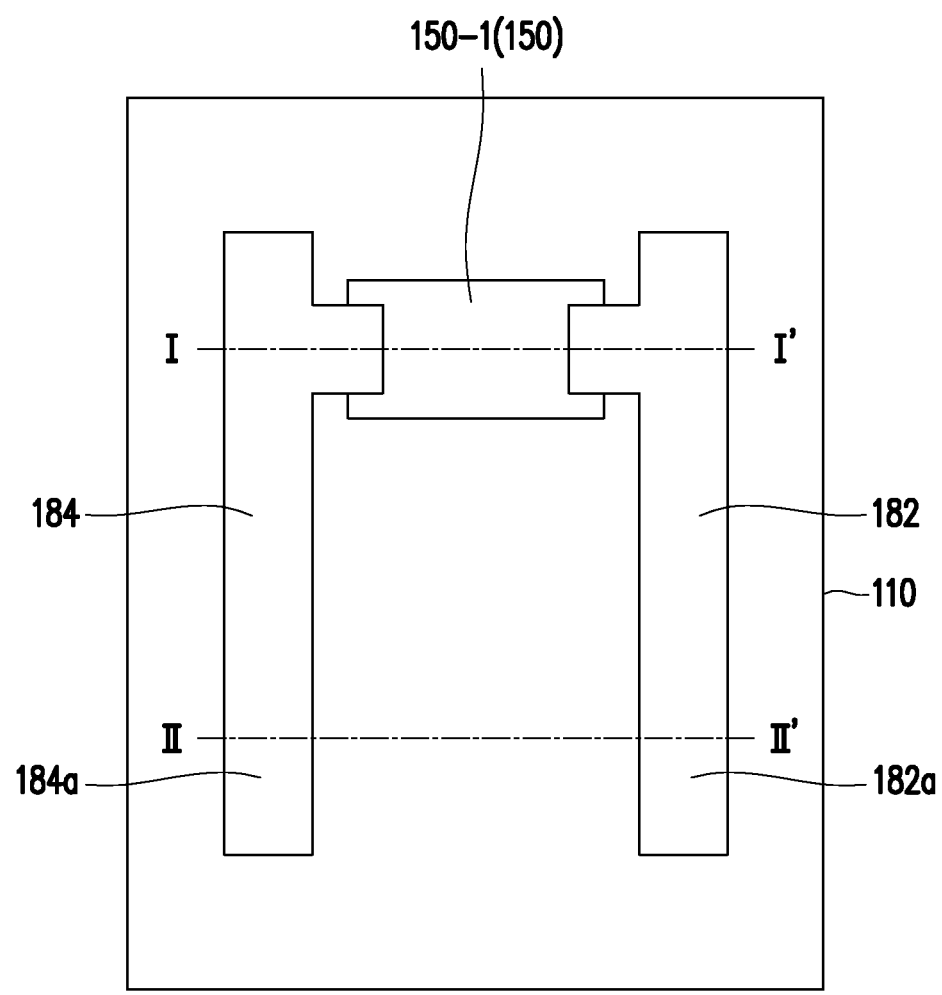
FIG. 10A to FIG. 10F are schematic top views showing a manufacturing process of a light-emitting apparatus according to a seventh embodiment of the present disclosure.
Figure 10B:
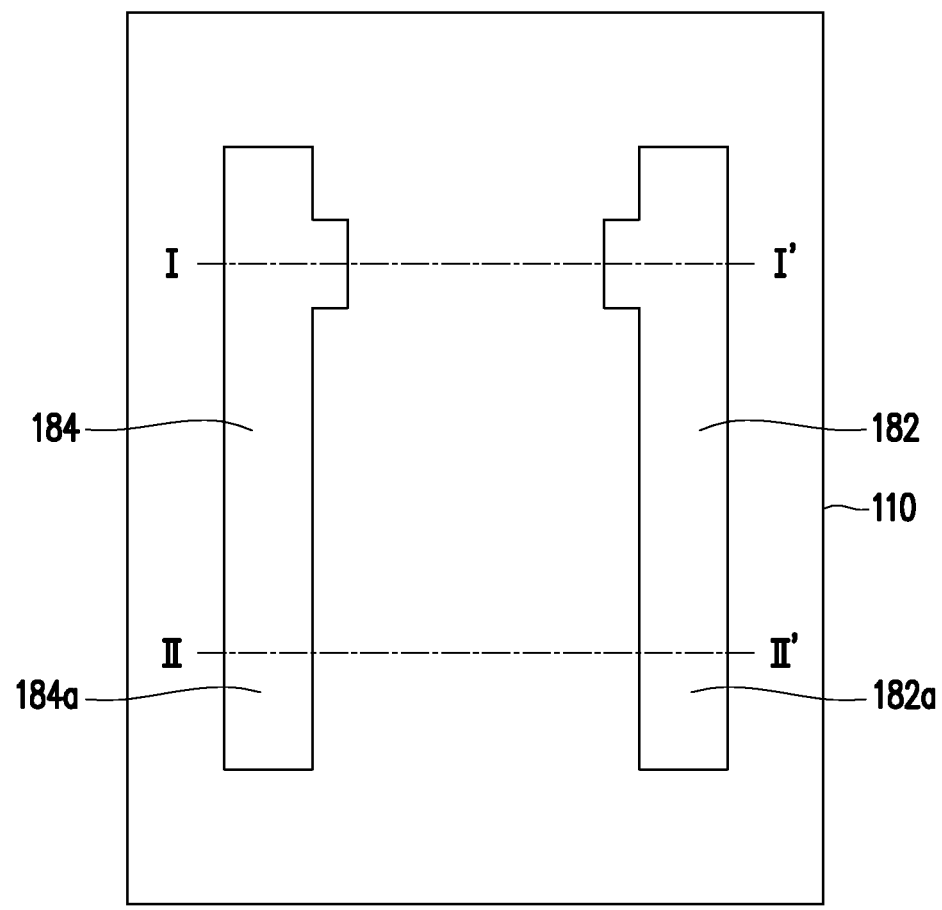

Referring to FIG. 9A and FIG. 10A, first, the active device substrate A is provided. The active device substrate A includes the substrate 110, the driving circuit layer 120 disposed on the substrate 110, the plurality of pads 130a and 130b electrically connected to the driving circuit layer 120, and the second dielectric layer 190 disposed on the plurality of pads 130a and 130b. The second dielectric layer 190 has contact vias 192 and 194 that overlap the plurality of pads 130a and 130b, respectively. The light-emitting diode element 150-1 is disposed on the second dielectric layer 190. The plurality of interconnection patterns 182 and 184 are respectively disposed on the plurality of electrodes 156a and 156b of the light-emitting diode element 150-1, and are electrically connected to the plurality of pads 130a and 130b respectively through the contact vias 192 and 194 of the second dielectric layer 190. Specifically, in the present embodiment, the interconnection patterns 182 and 184 have portions 182a and 184a that extend beyond the pads 130a and 130b without overlapping the pads 130a and 130b.

Referring to FIG. 9A and FIG. 10A, after the light-emitting apparatus is manufactured by using the conventional method, then the light-emitting apparatus is detected, and it is found that the light-emitting diode element 150-1 is abnormal and/or the electrical connection with the active device substrate A is poor. Referring to FIG. 9A, FIG. 9B, FIG. 10A, and FIG. 10B, then the light-emitting diode element 150-1 is removed.

Figure 9C:
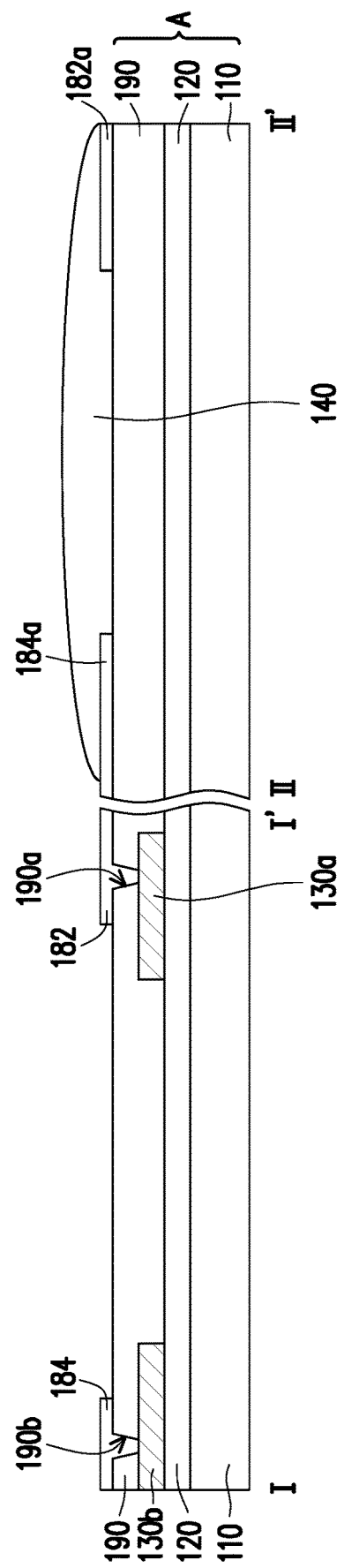
Figure 10C:
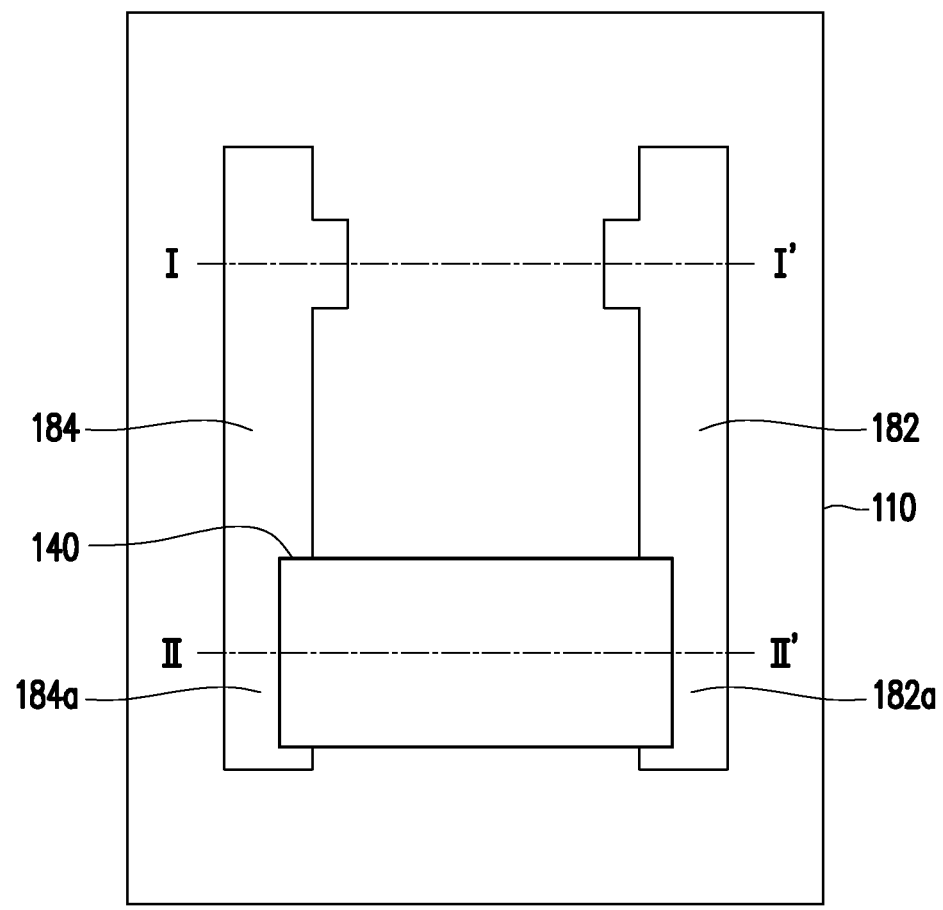
Figure 10D:
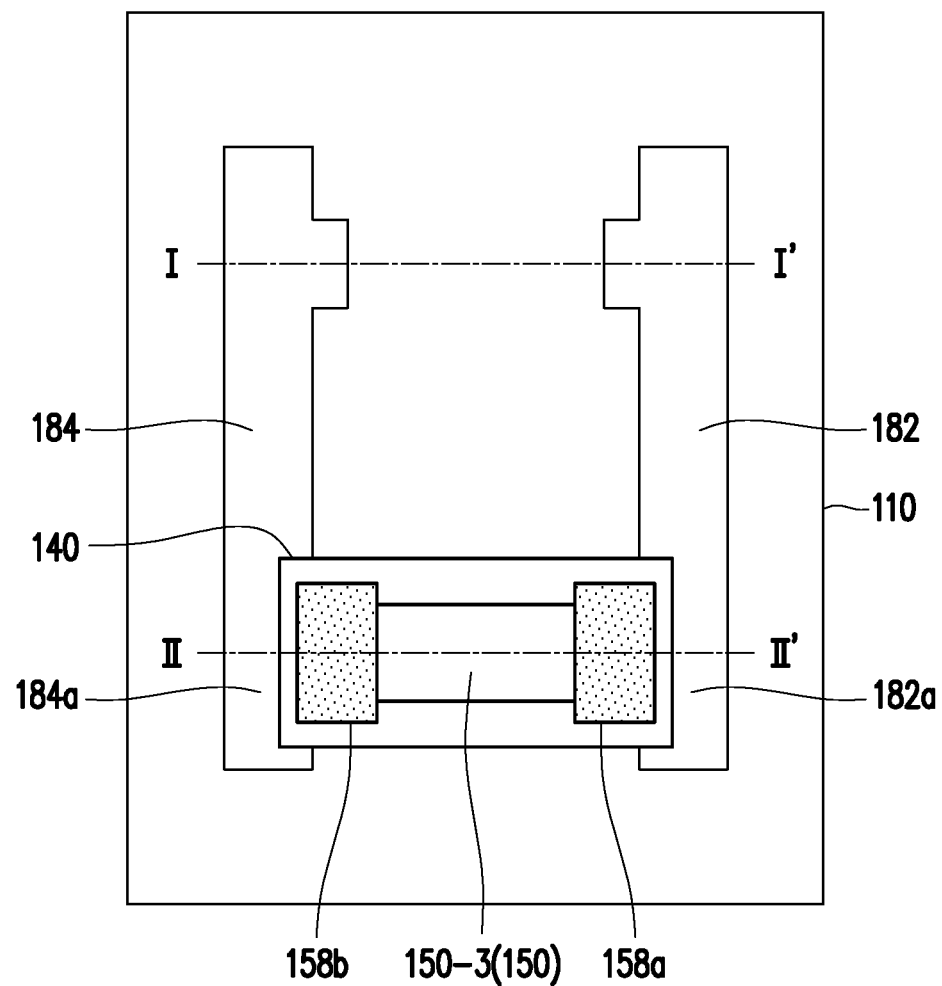
Figure 10E:
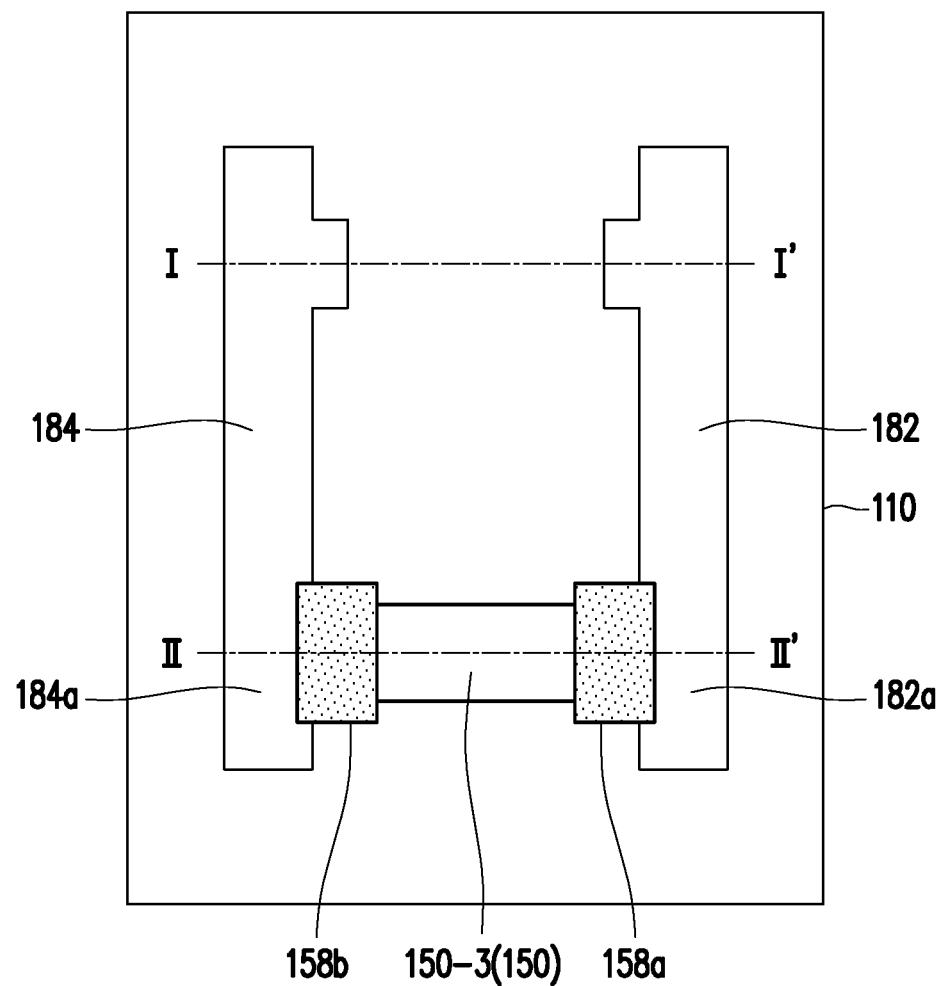

Referring to FIG. 9C and FIG. 10C, the sacrificial material layer 140 is formed on the substrate 110 to cover a portion 182a of the interconnection pattern 182 that does not overlap the pads 130a and 130b and a portion 184a of the interconnection pattern 184 that does not overlap the pad 130b.

Referring to FIG. 7D and FIG. 8D, next, the light-emitting diode element 150-3 is disposed on the sacrificial material layer 140. The light-emitting diode element 150-3 is bonded to the active device substrate A through the sacrificial material layer 140. The light-emitting diode element 150-3 also includes the plurality of connection patterns 158a and 158b.

Figure 9D:
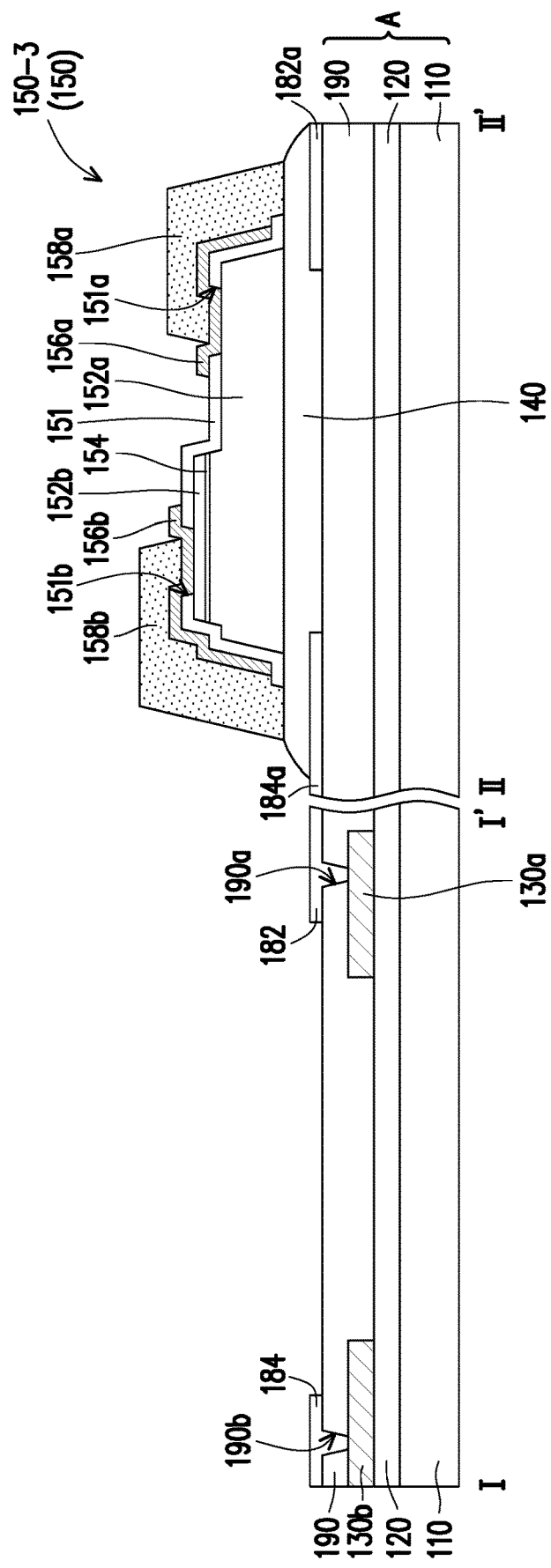
Figure 9E:
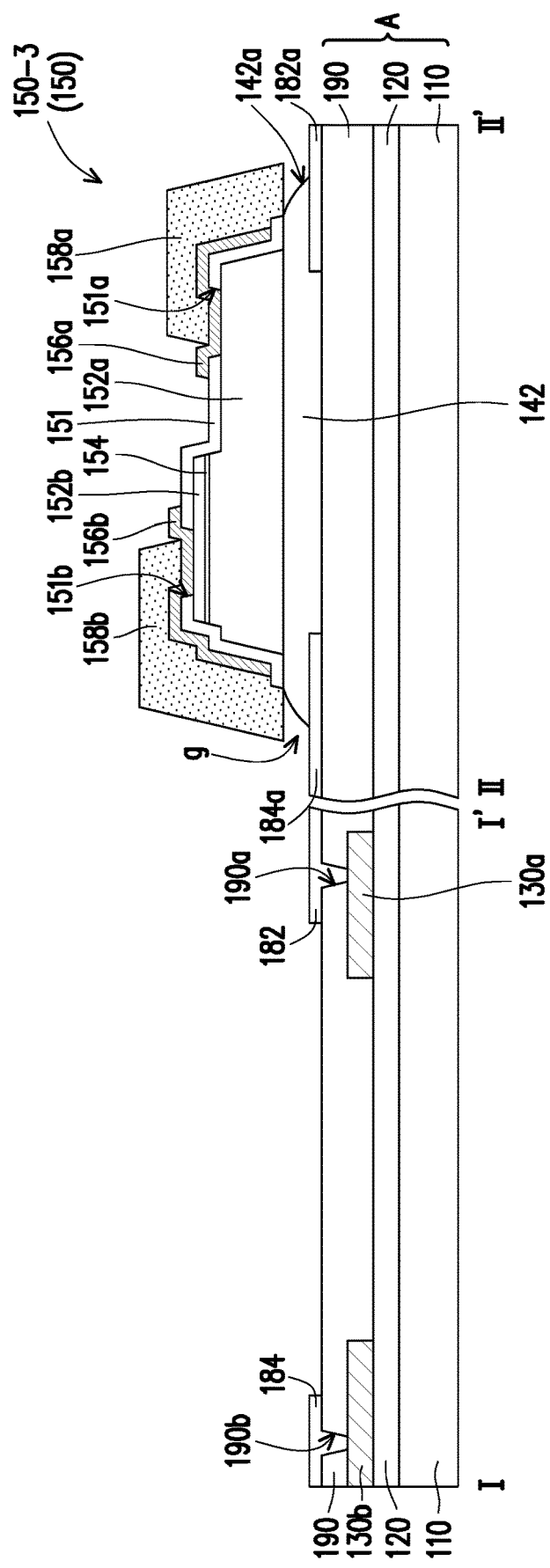

Referring to FIG. 9D, FIG. 9E, FIG. 9D, and FIG. 9E, then the sacrificial material layer 140 is patterned to form the sacrificial pattern layer 142, and the plurality of gaps g are formed between the plurality of connection patterns 158a and 158b of the light-emitting diode element 150 and the partial interconnection patterns 182a and 184a, wherein the sacrificial pattern layer 142 exposes at least a portion of each of the partial interconnection patterns 182a and 184a.

Figure 9F:
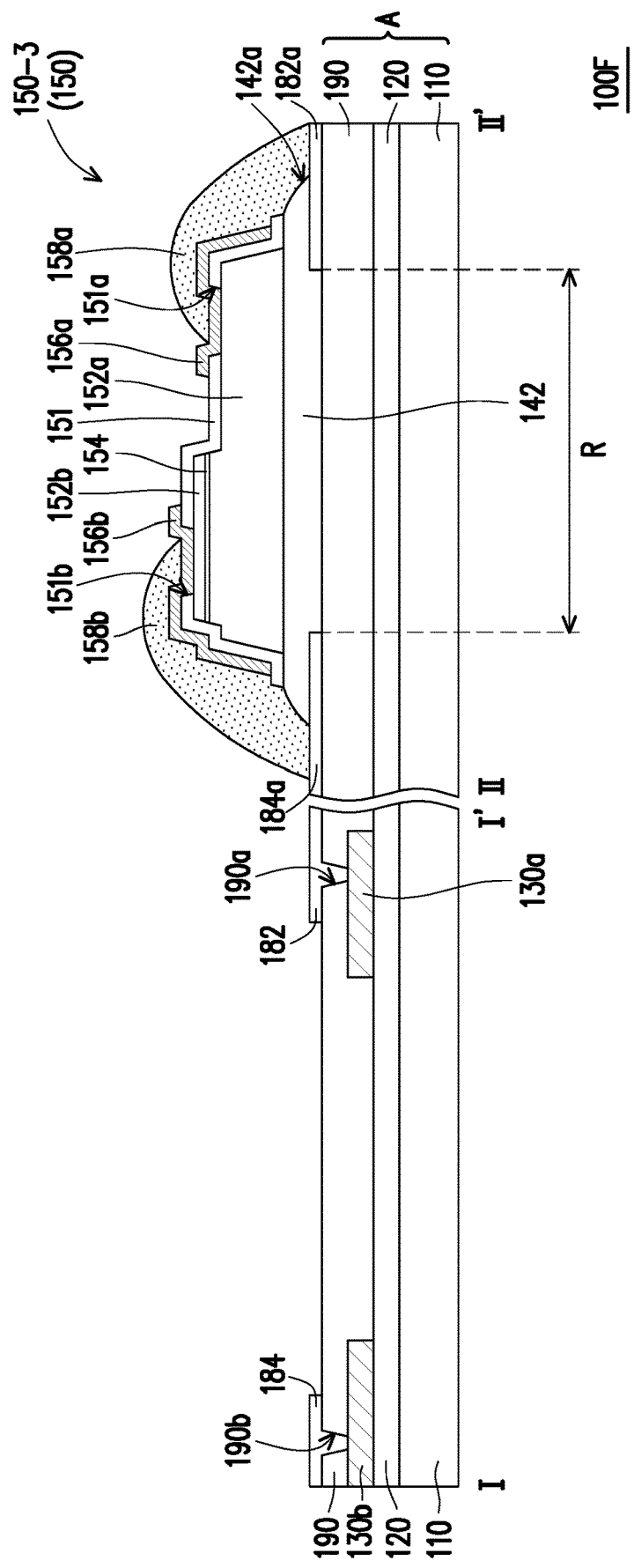
Figure 10F:
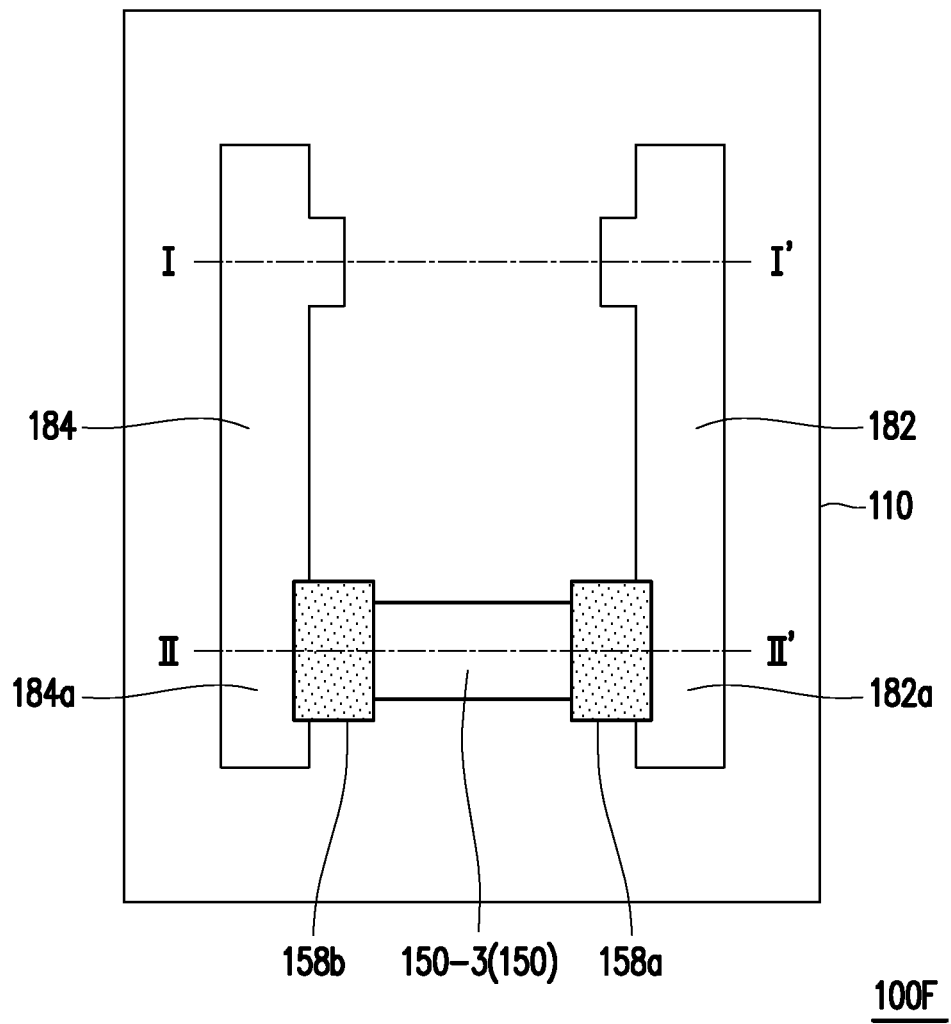

Referring to FIG. 9F and FIG. 10F, thereafter a heating process is performed to make the plurality of connection patterns 158a and 158b become flowable, and the flowable connection patterns 158a and 158b flow downward by gravity, and are electrically connected to a portion 182a of the interconnection pattern 182 not overlapping the pads 130a and 130b and a portion 184a of the interconnection pattern 184 not overlapping the pad 130b respectively. In the present embodiment, the connection patterns 158a and 158b of the light-emitting diode element 150-3 are in contact with and electrically connected to a portion 182a of the interconnection pattern 182 and a portion 184a of the interconnection pattern 184. A portion 182a of the interconnection pattern 182 and a portion 184a of the interconnection pattern 184 can also be regarded as a pad. The sacrificial pattern layer 142 is at least disposed in a region R between the portion 182a of the interconnection pattern 182 and the portion 184a of the interconnection pattern 184. The connection patterns 158a and 158b of the light-emitting diode element 150-3 are electrically connected to the pads 130a and 130b through the interconnection patterns 182 and 184. At the present stage, the repaired light-emitting apparatus 100F is completed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a light-emitting apparatus, comprising:

providing a substrate and a plurality of pads disposed on the substrate;

forming a sacrificial material layer on the substrate to cover the pads;
disposing a light-emitting diode element on the sacrificial material layer, wherein the light-emitting diode element comprises a first type semiconductor layer, a second type semiconductor layer, and an active layer disposed between the first type semiconductor layer and the second type semiconductor layer, and a plurality of electrodes electrically connected to the first type semiconductor layer and the second type semiconductor layer respectively;
forming a plurality of connection patterns respectively disposed on at least one of the electrodes, and materials of the connection patterns comprise hot fluidity conductive materials;
patterning the sacrificial material layer to form a sacrificial pattern layer, wherein a part of the sacrificial material layer is removed to form a plurality of gaps between the connection patterns and the pads, and the sacrificial pattern layer exposes at least a portion of each of the pads; and
performing a heating process to make the connection patterns to respectively flow into and filling the gaps and be contacted with and electrically connected to the pads.

2. The manufacturing method of the light-emitting apparatus according to claim 1, wherein the step of patterning the sacrificial material layer to form the sacrificial pattern layer comprises:
performing an over-etching process on the sacrificial material layer by using the light-emitting diode element as a mask to form the sacrificial pattern layer.

3. The manufacturing method of the light-emitting apparatus according to claim 2, wherein a vertical projection of the sacrificial pattern layer on the substrate is located within a vertical projection of the light-emitting diode element on the substrate, and an area of the vertical projection of the sacrificial pattern layer on the substrate is smaller than an area of the vertical projection of the light-emitting diode element on the substrate.

4. The manufacturing method of the light-emitting apparatus according to claim 1, wherein the sacrificial material layer serves as a bonding layer, and a material of the sacrificial material layer comprises a photoresist or a heat curing adhesive.

5. The manufacturing method of the light-emitting apparatus according to claim 1, wherein each of the connection patterns has a curve surface after subjected to the heating process.

* * * * *